US 6,583,456 B2

(12) United States Patent
Haga et al.

(10) Patent No.: US 6,583,456 B2
(45) Date of Patent: Jun. 24, 2003

(54) IMAGE SENSOR WITH LIGHT RECEIVING ELEMENTS OF DIFFERING AREAS AND IMAGE READER BOTH HAVING SEMICONDUCTOR DEVICE

(75) Inventors: Hiroshi Haga, Tokyo (JP); Ichiro Fujieda, Tokyo (JP); Fujio Okumura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/956,669

(22) Filed: Sep. 20, 2001

(65) Prior Publication Data

US 2002/0043674 A1 Apr. 18, 2002

Related U.S. Application Data

(62) Division of application No. 09/397,738, filed on Sep. 16, 1999, now Pat. No. 6,407,418.

(30) Foreign Application Priority Data

Sep. 16, 1998 (JP) ............................................. 10-261774
Apr. 28, 1999 (JP) ............................................. 11-120989

(51) Int. Cl.$^7$ ..................... H01L 31/062; H01L 31/113; H01L 31/06
(52) U.S. Cl. ........................ 257/292; 257/291; 257/443; 257/461; 257/465
(58) Field of Search ............................... 257/291, 292, 257/443, 461, 465

(56) References Cited

U.S. PATENT DOCUMENTS 5,329,149 A * 7/1994 Kawahara et al. .......... 257/435
5,338,946 A * 8/1994 Guidash ..................... 257/223
5,363,216 A * 11/1994 Kim .......................... 358/482
5,602,585 A * 2/1997 Dickinson et al. .......... 348/155
6,034,406 A    3/2000 Kobayashi et al.
6,051,857 A    4/2000 Miida
6,069,376 A    5/2000 Merrill
6,150,683 A * 11/2000 Merrill et al. .............. 257/292

FOREIGN PATENT DOCUMENTS

| JP | 60-22881 | 2/1985 |
| JP | 4-56461 | 2/1992 |
| JP | 4-261258 | 9/1992 |
| JP | 6-196484 | 7/1994 |
| JP | 6-231301 | 9/1994 |
| JP | 6-276365 | 9/1994 |
| JP | 6-291935 | 10/1994 |
| JP | 9-205518 | 8/1997 |
| JP | 10-39336 | 2/1998 |
| JP | 10-228032 | 8/1998 |
| JP | 10-325961 | 12/1998 |

OTHER PUBLICATIONS

ISSCC 98, Digest of Technical Papers, vol. 41, p. 174, Feb. 1998.

* cited by examiner

Primary Examiner—Ngân V. Ngô
(74) Attorney, Agent, or Firm—Scully, Scott, Murphy & Presser

(57) ABSTRACT

An insulating substrate and a scanning circuit region are provided on a semiconductor device. The scanning circuit region is provided with a switching transistor for outputting charge formed on the insulating substrate and a clock wiring determining switching timing of the switching transistor. A shield conductor member is provided below the scanning circuit region.

11 Claims, 37 Drawing Sheets

C12=1.5pF/m
C22=115pF/m
C32=115pF/m

C11=12pF/m

IMAGE SENSOR WITH LIGHT RECEIVING ELEMENTS OF DIFFERING AREAS AND IMAGE READER BOTH HAVING SEMICONDUCTOR DEVICE

CROSS REFERENCE TO RELATED APPLICATION

The present application is a divisional of application Ser. No. 09/397,738 filed on Sep. 16, 1999, now U.S. Pat. No. 6,407,418

BACKGROUND OF THE INVENTION

1. Field of the Invention

The present invention relates to a semiconductor device which can operate at high speed and a method of manufacturing the semiconductor device, as well as an image sensor apparatus and an image reader both having the semiconductor device.

2. Description of the Related Art

As image sensors which read an image and output an image signal in accordance with the image, there are known a MOS type sensor, a CCD sensor and the like. The image sensor is also classified into a compact type image sensor and a close-contact type image sensor.

Whichever the type, the image sensor has higher resolution and lower sensitivity as the light receiving area of each of the light receiving elements which are the constituent elements for the image sensor is smaller. That is, the higher the resolution of an image sensor is, the slower the reading speed becomes. There are two reasons for slower reading speed. The first is the increase of storage time resulting from the lowered sensitivity. The second is the increase of scanning time for scanning all of the light receiving elements.

It is desirable that the resolution of the sensor in a main scanning direction and that in a sub-scanning direction are equal to each other two-dimensionally. If so, the sensitivity of the sensor is inversely proportional to the square of the resolution. Namely, if the resolution is doubled, the sensitivity is lowered to one-fourth.

In designing an image reader, the optical resolution of the reader is, in many cases, determined at the time the image sensor is selected. Therefore, apparatus designers have trouble in selecting an image sensor to be mounted on the image reader in view of optical resolution and reading speed.

An image reader is conventionally provided with switching means for switching over reading concentration and can read an image with a resolution lower than an optical resolution. The switching of reading concentration is, however, carried out by image process such as thinning-out process for changing the sampling concentration of an image signal per unit length or averaging process for averaging image signals after the images are read with the optical resolution characteristics of the image reader. For that reason, the switching of the reading concentration does not substantially change the area of light receiving elements and it still requires lot of reading time.

To remove the above disadvantage, recently disclosed are image sensors switching over reading concentration to a low level, increasing reading speed or improving an S/N ratio by outputting the sum of the signals of a plurality of adjacent light receiving elements (Japanese Patent Application Laid-Open No. 6-276365 and No. 9-205518 and "ISSCC 98, DIGEST OF TECHNICAL PAPERS, p174" and the like).

FIG. 1 is a circuit diagram showing the structure of a conventional image reader disclosed by the Japanese Patent Application Laid-Open No. 6-276365. FIGS. 2A and 2B are timing charts showing the operation of the image reader shown in FIG. 1. It is noted that FIG. 2A indicates the operation of the reader while images are read with high resolution and that FIG. 2B indicates the operation thereof while images are read with low resolution.

The image reader disclosed by this Japanese Patent Application Laid-Open No. 6-276365 is provided with light receiving elements PD2-m1 and the like, switching elements T2-m1 and the like, control lines G2-m and the like connected to the switching elements T2-m1 and the like, respectively and a driver circuit driving the control lines G2-m and the like, as shown in FIG. 1.

In this image reader, if an image is read with high resolution, one control line is driven simultaneously as shown in FIG. 2A. If an image is read with low resolution, two or more control lines are driven at one time as shown in FIG. 2B. If the control lines are driven as shown in FIG. 2B, signals of two or more light receiving elements adjacent to a common data line are simultaneously outputted and a low resolution image can be obtained without conducting image processing such as averaging process.

In addition, since charges of the two or more light receiving elements are transferred by a single driving operation, the number of driving operations is decreased and reading time is shortened accordingly.

Although reading time is shorter than that for previous image sensors, the light receiving area is not doubled in case of reducing the resolution by half. Therefore, the sensitivity of the reader is nothing more than half as high as that of a low resolution sensor. Further, since a plurality of light receiving elements are switched on once, the mixture of feedthrough noise caused by the switching operation disadvantageously increases.

Meanwhile, in an image sensor according to the Japanese Unexamined Patent Application Publication No. 9-205518, a plurality of light receiving elements are arranged in columns and outputs from the respective rows of the elements are composed and sequentially outputted in a low resolution mode to thereby increase the sensitivity of the sensor in the low resolution mode.

Even with the image sensor disclosed by this publication, the sensitivity is only doubled when the resolution is halved and the sensitivity is nothing more than a half as high as that of the low resolution sensor as in the case of the above publication.

According to "ISSCC98, DIGEST OF TECHNICAL PAPERS, p174", a two-dimensional CMOS area sensor is provided with column integrators and column memories on all column output lines and with a global integrator on the final output line of the sensor, whereby the sum of the signals of light receiving elements adjacent to one another two-dimensionally can be outputted.

With this imager, the sum of the outputs from the light receiving elements is obtained two-dimensionally, the sensitivity increases fourfold when the resolution is halved and the same sensitivity as that of a low resolution sensor can be obtained.

Nevertheless, due to its complicated circuit arrangement, the imager has disadvantage of lower yield, the great increase of the chip area and the like. Further, in consideration of the present transistor performance, more fine manufacturing process is required than that for a crystalline silicon LSI and it is quite difficult to adapt this imager to a thin film transistor driving type image sensor.

Moreover, there is disclosed a character reader in which two image sensors, i.e., a high resolution CCD sensor and a low resolution CCD sensor, are installed and the output signals of the two sensors are switched to thereby read characters at high speed with low resolution (Japanese Patent Application Laid-Open No. 6-231301).

The character reader disclosed by this publication is intended to solve the challenges shared among the readers. However, since the two sensors are mounted on the reader, two optical systems or two optical paths are needed. As a result, the reader has disadvantage in that the apparatus becomes larger in size, the number of assembly steps increases and the like. Besides, the reader disclosed by this publication differs from the preceding readers in technical concept.

Further, there is disclosed an image reader consisting of an image sensor in which a plurality of lines, on which a plurality of light receiving elements are arranged in one direction, are arranged in a plurality of sub-scan directions (Japanese Patent Application Laid-Open No. 4-56461). In this image reader, signal charges stored in light receiving elements on the respective lines are line-shifted in sub-scanning direction for every sub-scanning cycle.

There is also disclosed an image reader intended to realize high resolution and high transfer efficiency (Japanese Patent Application Laid-Open No. 4-261258). According to this publication, there are provided a plurality of light receiving elements for conducting photoelectric transfer, color filters having difference spectral characteristics formed on the light receiving elements, respectively, illumination means for illuminating a manuscript, image-forming means for forming an image of the manuscript the light receiving elements and signal conversion means for converting electric signals from the light receiving elements to signals of three primary colors on the image reader. The image reader resolves a scanning line of the original into a plurality of pixels and outputs a color signal per pixel. The first color filter is formed on the light receiving elements of the same number as that of pixels. Color filters other than the first color filter are formed on the light receiving elements less than the pixels. A circuit for conducting interpolation operation from electric signals corresponding to the color filters other than the first color filter is provided in the signal conversion means.

As a semiconductor device in which semiconductor elements are formed on an insulating substrate, there is conventionally known a semiconductor device in which thin film transistors using a polycrystalline silicon film are formed on a glass substrate. This semiconductor device, which employs a glass substrate, is applicable to an optical device such as a liquid crystal display device. The semiconductor device is advantageous in that a cost is low, the parasitic capacitance of wirings is quite low, and chip size is less limited and the like.

An image sensor using the above semiconductor device is disclosed by, for example, Japanese Patent Application Laid-Open No. 60-22881. FIG. 3 is a block diagram showing a conventional image sensor disclosed by Japanese Patent Application Laid-Open No. 60-22881.

The conventional image sensor shown therein is a one-dimensional close-contact type one. The image sensor is provided with a scanning circuit 101 having a thin film transistor, a switch 105 formed of a thin film transistor and a semiconductor light conductive film. The thin film transistor is formed by using polycrystalline silicon on an insulating substrate. An element 102, a switching circuit 103 and a light sensitive cell 104 are also formed in the image sensor. The chip size of the image sensor is set at, for example, 30 cm in lengthwise direction of the sensor.

A serious problem, however, occurred when the inventor of the present invention tried to manufacture such an image sensor on a glass substrate and to operate it. The image sensor manufactured by the present inventor will be described. FIG. 4 is a block diagram showing the structure of the image sensor manufactured by the present inventor. FIG. 5 is a cross-sectional view showing the structure of the image sensor.

This image sensor is a one-dimensional close-contact type one in which a circuit is formed on a glass substrate of 1.1 mm in thickness. The size of a chip in lengthwise direction of the image sensor is 120 mm and that in breadthwise direction thereof is 2 mm. A CMOS scanning circuit 101 made of polycrystalline silicon thin film transistors, switches 105 made of polycrystalline silicon thin film transistors and photodiodes 113 made of amorphous silicon thin films are formed on the circuit of this image sensor. The scanning circuit 101 is basically the same as a shift register. The output signals of the respective stages of the shift registers are inputted to gate terminals 114 of the switches through buffers. Using the output signals, the corresponding switches are on/off controlled. The number of scanning stages of the scanning circuit 101, i.e., the number of photodiodes is 864. The image sensor includes parasitic elements C1 to C8 and Cgd, which will be described later.

An I-V converter 111 is connected as an initial stage amplifier to the output terminal 115 of the image sensor constituted as stated above and an integrator 112 is connected to the output of the I-V converter 111.

As shown in FIG. 5, at the time of manufacturing the above-stated image sensor, a silicon oxide film 121 was formed on a glass substrate 120 of 1.1 mm in thickness. A thin film transistor 123, including a polycrystalline silicon film 100 as an active layer, is formed on the silicon oxide 121. Next, a gate electrode 124 for the thin film transistor 123 is formed and the gate electrode 124 is covered with an interlayer insulating film 125 made of a silicon oxide film. A photodiode 126 is formed on the interlayer insulating film 125 in a region different from that of the thin film transistor 123. Thereafter, these elements are connected to an aluminum wiring 128 and a passivation film 127 is formed on the entire surface.

Reference symbol "a-Si" denotes a-Si:H (amorphous silicon). Reference symbol "a-SiC" denotes $P^+$-a-SiC:H ($P^+$ amorphous silicon carbide). Since $P^+$-a-SiC:H film is formed to be coupled with a-Si and deposited by 400 angstrom, the $P^+$-a-SiC:H thinly covers a-Si.

The system of the fundamental operation of the image sensor constituted as described above is a so-called storage system in which a reverse bias is applied to a photodiode and charge according to exposure quantity is read in the next scanning. If the output signals of the respective stages of the 864-bit shift registers are sequentially outputted, switching transistors are sequentially selected and charging currents of the respective photodiodes are carried across an output line. Signals each obtained by integrating the charging current for every stage are the charge stored in the photodiodes according to exposure quantity. Therefore, the output signals of the integrator become signal levels proportional to exposure quantity.

The inventor of the present invention assembled an image sensor module using the above-stated image sensor and causes the module to read images of a print. FIG. 6 is a typical cross-sectional view showing the image sensor module assembled by the inventor.

The image sensor module is provided with an image sensor 110 as constituted above, a light source 130 arranged on the back side of an image sensor substrate, an optical fiber array plate 131 bonded onto the light receiving surface of the image sensor with an adhesive agent 136, a roller 132, a printed board 133 and a case 134. An ITO (indium tin oxide) film 135 is deposited on the surface of the optical fiber array plate 131 for preventing noise and the film 135 is grounded. Photodiodes 113 are formed on the image sensor 110 and optical fibers 223 arranged on the base glass 222 are provided on the optical fiber plate 131.

In the image sensor module constituted as stated above, light from the light source 130 arranged on the back side of the image sensor 110 is permeated by the image sensor substrate serving as a glass substrate and illuminates a manuscript (not shown) through the optical fibers 223. The light reflected by the original is quantized in units of optical fibers 223 and transmitted to the respective photodiodes 113 of the image sensor 110.

The image sensor module reads information on the manuscript by sub-scanning the original in the rotation direction of the roller. The detailed structure of this module is described in Japanese Patent Application Laid-Open No. 6-291935.

When the inventor of the present invention drove the image sensor module constituted as described above, the following problems occurred.

First, the output of the initial stage amplifier 111 connected to the output terminal 115 of the image sensor 110 is saturated by impulse noise synchronous with the transition of a clock signal. Due to this phenomenon, the gain of the initial stage amplifier is limited. This requires decreasing gain not to saturate the output. To decrease gain normally causes the reduction of the S/N ratio.

Second, as for the output signal of the integrator 112, fixed pattern noise (even and odd number signal difference: Qs) in which the output signals of the even-number stages and those of the odd-number stages of the image sensor split, appears and the even and odd number signal difference Qs varies. This variation will be expressed by ΔQs hereinafter. If the variation occurs, stripe noise appears on the image.

FIG. 7 is a graph showing the waveforms of the output signal of the image sensor. In FIG. 7, the output waveform of the integrator from tenth to thirteenth stages when a blank manuscript is read and the waveform of clocks supplied to the scanning circuit. As shown in FIG. 7, the output of the even-number stages differs from that of the odd-number stages. The features of this phenomenon indicates that the above-mentioned problems are caused by the mixture of noise through parasitic elements.

The parasitic elements C1 to C8 and Cgd shown in FIG. 4 are main parasitic capacitances in the image sensor. After the inventor conducted analysis in detail, he discovered that the capacitance C1 between a clock 1 wiring 140 and an output wiring 142 and the capacitance C2 between a clock 2 wiring 141 and an output wiring 142 caused the above problems. That is, the inventor discovered that large clock noise got mixed in the output wiring 142 through the parasitic capacitances C1 and C2.

FIG. 8 is a typically perspective view showing the layout of the wirings on the image sensor shown in FIG. 4. The layout shows that the clock 1 wiring 140, clock 2 wiring 141 and output wiring 142 are all connected to and extended through the first to 864$^{th}$ stages of the image sensor. These wirings are normally called bus-lines. The wirings 140, 141 and 142 are parallel and have almost the same length as the lengthwise size of the image sensor 110. Thus, as the sensor is longer in lengthwise direction, the parasitic capacitances of the wirings increase proportionally. To be specific, the values of the parasitic capacitances C1 and C2 were 840 fF and 605 fF, respectively.

A clock signal has amplitude of 5V. The clock 1 signal is opposite in phase to the clock 2 signal. The charge applied to the output wiring 142 through the capacitance C1 at the rise of the clock 1 signal is as follows:

$$5(V) \times 840(fF) = 4200(fC).$$

Meanwhile, the charge applied to the output wiring 142 through the capacitance C2 is as follows:

$$-5(V) \times 605(fF) = -3025(fC).$$

Therefore, charge of 1175 fC is consequently superimposed on an output signal.

Since the output signal of the next stage is outputted at timing at which the clock 1 signal falls, a phenomenon opposite to the above occurs and charge of −1175 fC is superimposed on an output signal. The inventor of the present invention discovered that this caused the even and odd number signal difference Qs. Further, the application of the large charges was the main cause for the saturation of the output signal of the initial stage amplifier by the impulse noise synchronous with the transition of the clock signal.

The signal charge quantity tends to be smaller and smaller so as to meet demand for high-speed image readout. The noise charge of 1175 fC shown above corresponds to one to ten times as large as signal charge, which causes a serious problem.

As stated above, the quantity of charge applied to the output wiring 142 from the clock wirings 140 and 141, that is, the values of the products of the clock amplitude voltage and capacitance values of the parasitic capacitances C1 and C2, respectively are quite high compared with the output signal charge quantity. Although the clock wirings 140 and 141 are driven by clock signals opposite in phase and noise is slightly cancelled, noise is not canceled sufficient due to the difference between the parasitic capacitances C1 and C2. Even if the values of the parasitic capacitances C1 and C2 are accurately matched with each other, the charge quantity mixed in the capacitances C1 and C2 is easily changed due to the variation of the clock amplitude voltage, with the result that the noise cannot be canceled.

The cause which makes the above problems more complicated is that these parasitic capacitances C1 and C2 are formed in a wide space around the sensor. FIG. 9 shows the equipotential and the electric line of force resulting from the parasitic capacitances present between the clock 1 wiring and the output wiring while the image sensor is floated in the air. The potential of the clock 1 wiring 140 is set at 5V and those of the remaining wirings such as wiring 142 are set at 0V.

If wirings are formed on an insulating substrate such as a glass substrate, a ground potential surface does not exist. Owing to this, capacitances are parasitized through the interior of the glass substrate serving as a dielectric, the air of the back surface of the glass substrate, that of the surface of the sensor and the like.

In the above-stated image sensor, the electric line of force indicated by a broken line spreads wide through the space of the outside of the image sensor as shown in FIG. 9. This means that the values of the parasitic capacitances C1 and C2 easily vary according to the influence of objects existing in the space outside the image sensor.

FIG. 10 shows the equipotential resulting from the parasitic capacitances present between the clock 1 wiring and the output wiring if a ground metal plate is provided on the back side of the image sensor shown in FIG. 9. Compared with a case where the image sensor is floated in the air, the state of the equipotential greatly varies and the values of the parasitic capacitances C1 and C2 greatly vary as well.

The values of the parasitic capacitances C1 and C2 are shown in Table 1 below.

TABLE 1

|        | When image sensor is floated in the air | When metal plate is provided |
|--------|------------------------------------------|------------------------------|
| C1 (fF) | 840                                     | 220                          |
| C2 (fF) | 605                                     | 230                          |

The capacitance values increase threefold.

The variation $\Delta Qs$ of the even and odd number signal difference Qs occurs when the scanner module 161 is made closer to the ground metal plate 160 or away from the plate 160 as shown in FIG. 11. The values of the parasitic capacitances C1 and C2 these times are shown in Table 2 below:

TABLE 2

|        | When scanner module is sufficiently away from metal plate | when scanner module is put on metal plate |
|--------|------------------------------------------------------------|--------------------------------------------|
| C1 (fF) | 840                                                       | 220                                        |
| C2 (fF) | 605                                                       | 230                                        |

As can be seen from the Table 2, if the values of the parasitic capacitances C1 and C2 vary, the difference between the values vary as well and the variation $\Delta Qs$ of the even and odd number signal difference Qs occurs.

In this way, the causes of the problems with the conventional image sensor are: the coupled capacitance between wirings is large; and the capacitance value varies. Normally, if a circuit is formed on an insulating substrate, the wirings are not strongly coupled with the substrate and the coupled capacitance between the wirings, therefore, becomes large. FIG. 12A is a typical view of a model showing that parallel wirings are formed on a silicon substrate. FIG. 12B is a typical view of a model showing that parallel wirings are formed on a glass substrate.

As shown in FIG. 12A, if two parallel wirings 170 and 171 are formed above a silicon substrate 173 to be distant from each other by 5 $\mu$m through an insulating film 172 of 1 $\mu$m, the capacitance value of the wirings is 117 pF/m.

On the other hand, as shown in FIG. 12B, if parallel wirings are formed on a glass substrate in a space in which other conductors are not present, the parasitic capacitance value of the wirings is 12 pF/m.

As can be seen from the above, the parasitic capacitance value of the wirings in the model shown in FIG. 12B is smaller. As for the capacitance between the wirings which causes cross-talk, however, the capacitance in the model of FIG. 12A is 1.5 pF/m and that in the model of FIG. 12B is 12 pF/m, so that the capacitance in the model of FIG. 12B is eighth as large as that in the model of FIG. 12A.

This problem also occurs to devices other than an image sensor, e.g., a liquid crystal display device on which driver circuits are formed on a single substrate.

The inventor of the present invention discovered that noise generated from the clock signal wirings easily get mixed in other wirings in the semiconductor device on which semiconductor elements are formed on an insulating substrate, which causes serious problems, as described above.

SUMMARY OF THE INVENTION

It is, therefore, an object of the present invention to provide a semiconductor device operating at high speed with less noise and a manufacturing method thereof, as well as an image sensor apparatus and an image reader both having the semiconductor device.

According to one aspect of the present invention, a semiconductor device may comprise an insulating substrate, a first semiconductor element region having a digital signal wiring formed on the insulating substrate, a second semiconductor element region having an analog signal wiring formed on the insulating substrate, and a shield electrode provided at least one of above and below only the first semiconductor element region out of the first and second semiconductor element regions.

According to another aspect of the present invention, an image sensor apparatus may comprise a substrate and a plurality of light receiving element groups formed on the substrate. The plurality of light receiving element groups differs in light receiving area from one another.

According to the present invention, an image signal from a light receiving element having an optimum light receiving area in main-scanning and sub-scanning directions in accordance with the selected resolution. Therefore, if the resolution of the sensor apparatus is lowered to 1/R, the sensitivity thereof increases to about the square of R.

According to the present invention, the number of light receiving element arrays should not be always specified to a specific number and two or more types of light receiving arrays can be used.

Further, in the present invention, a plurality of light receiving elements forming a light receiving array are desirably arranged in a row in a main-scanning direction, i.e., a direction coincident with the width direction of a recording medium such as a manuscript, however, the arrangement of the light receiving elements is not necessarily limited thereto.

Moreover, in the present invention, it is preferable that an appropriate protective member protecting the light receiving elements is provided between the light receiving element array and a recording medium such as a manuscript with which the array comes into direct, close contact. In addition, the portion of the protective member which faces the light receiving element array is preferably provided with an opening portion, a honeycomb structure or a light transmitting part formed by arranging a bundle of optical fibers. With this constitution, sufficient illumination applied from the above of the image sensor is supplied to the recording medium.

The image sensor apparatus may comprise a drive output circuit provided with shift registers sequentially selecting a light receiving element to be driven out of the light receiving elements at predetermined timing, a light receiving element array selection control circuit selecting a predetermined light receiving element array from the plurality of light receiving element arrays, a decoder circuit outputting a light receiving element selection signal for selecting the light receiving element based on output signals of the drive output circuit and the light receiving element array selection control circuit and pixel switches selectively driving the light receiving elements based on an output signal of the decoder circuit. In this case, the pixel switches and the like may be formed around the light receiving elements on the substrate simultaneously with the formation of the light receiving elements. Also, they may be arranged on the peripheral portion of the substrate.

DESCRIPTION OF THE PREFERRED EMBODIMENTS

Figure 13:
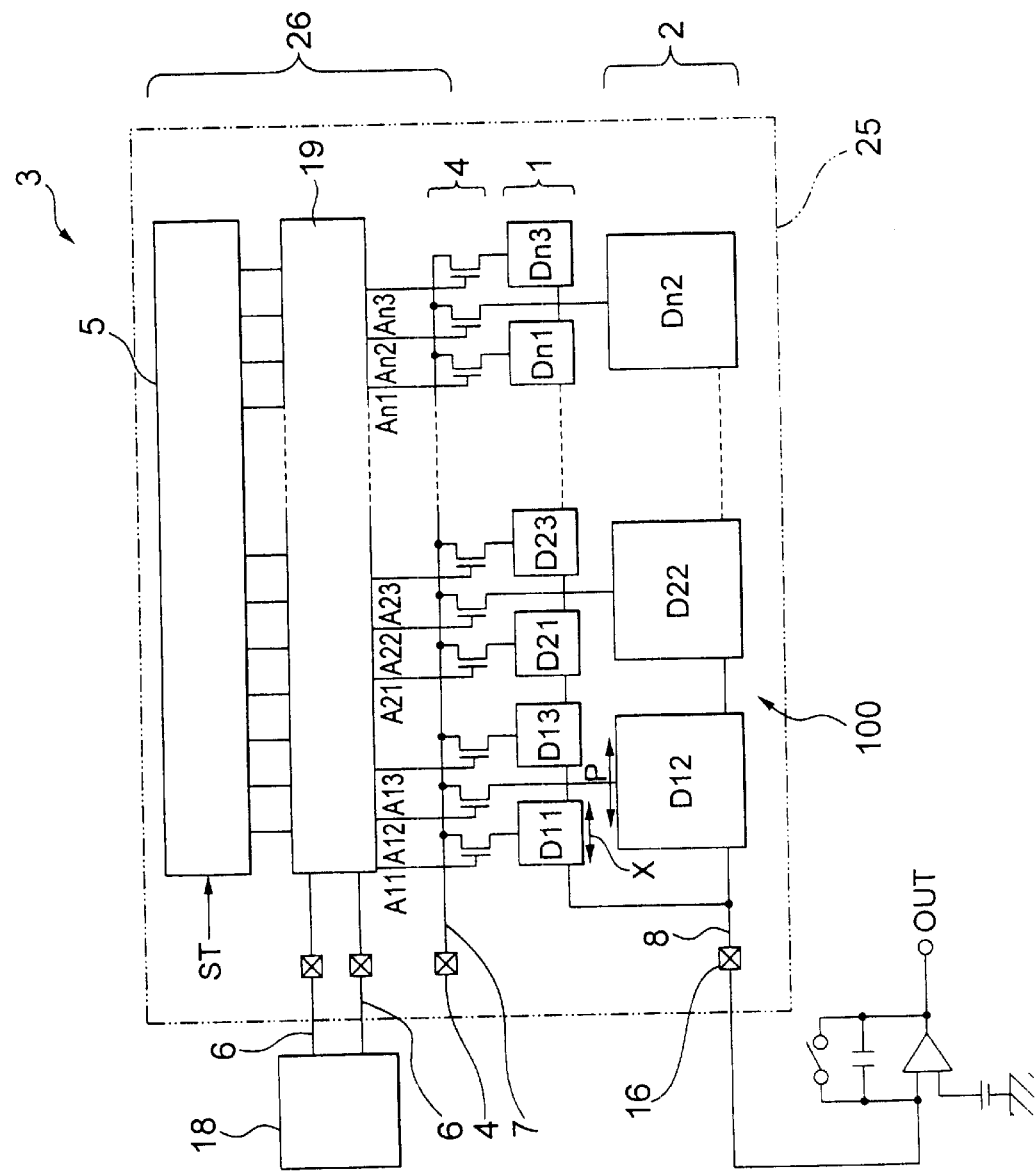
FIG. 13 is a block diagram showing the structure of an image sensor in the first embodiment according to the present invention.

Hereinafter, image sensors in embodiments according to the present invention will be described specifically with reference to the accompanying drawings. FIG. 13 is a block diagram showing the structure of an image sensor in the first embodiment according to the present invention.

In the first embodiment, a plurality of light receiving element arrays 1 and 2 having different light receiving areas are provided on a single image sensor substrate 25. The image sensor substrate 25 may be, for example, an insulating substrate such as a glass substrate. Each light receiving element array has a light receiving area according to target resolution. A drive control circuit 26 selecting and driving one of light receiving elements D11, D21, ..., Dn1, D12, D22, ..., Dn2, D13, D23, ..., Dn3 corresponding to a selected resolution, is provided on the image sensor substrate 25.

Although it is desirable that the sensor has a constitution in which an optical system from the surface of a manuscript to a light receiving surface is common and an object lens as well as an optical system accompanying the lens is not required, an optical system having an object lens may be employed.

The image sensor 3 in the first embodiment is, for example, a close-contact type line image sensor which can select one of the two types of resolutions (400 dpi and 200 dpi) for a light receiving element.

The light receiving element array 1 having a plurality of light receiving elements D11 to Dn1 and D13 to Dn3 for 400 dpi resolution and the light receiving array 2 having a plurality of light receiving elements D12 to Dn2 for 200 dpi resolution are provided on the image sensor 3. Each of the light receiving elements D11 to Dn1, D12 to Dn2 and D13 to Dn consists of, for example, a photodiode and the like. The image sensor 3 is also provided with a plurality of pixel switches 4 connected to the respective light receiving elements and a driver circuit 5 for turning on/off the pixel switches 4 according to resolution. A decode circuit 19 is connected between the pixel switches 4 and the driver circuit 5.

As will be described later, the driver circuit 5 is desirably provided with, for example, a shift register circuit and a shift register output circuit.

All of these constituent elements are formed on the insulating substrate 25 such as a glass substrate using thin film process.

The cathode electrode of each of the light receiving elements D11 to Dn1, D12 to Dn2 and D13 to Dn3 is connected to a bias line 7 through a corresponding pixel switch 4 and an anode electrode thereof is connected to a common readout wiring 8. The potential of the anode electrode is outputted as a picture signal 16.

The pitch P of the light receiving elements D11 to Dn1 and D13 to Dn3 for 400 dpi resolution and a light receiving width X thereof may suffice if they satisfy the relationship of 0<(X/P)<1. An MTF value at Nyquist frequency while this relationship is satisfied is:

$$(MTF)_N = \sin(\pi/2) \cdot (X/P)/(\pi/2) \cdot (X/P).$$

The MTF value in sub-scanning direction may be the same as that in main scanning direction.

That is to say, it is preferable that the light receiving elements D11 to Dn1 and D13 to Dn3 are square pixels with a vertical length equal to a horizontal length. It is set, for example, that the pitch P is 62.5 $\mu$m, the light receiving width X is 50 $\mu$m and (X/P) is 0.787.

Meanwhile, the values of the pitch and the light receiving width of the light receiving elements D12 to Dn2 for 200 dpi resolution may be set to be twice as high as those for 400 dpi resolution, respectively. By so setting, the sensitivity of the sensor with 200 dpi resolution is four times as high as that of the sensor with 400 dpi resolution and storage time can be shortened.

Figure 14A:
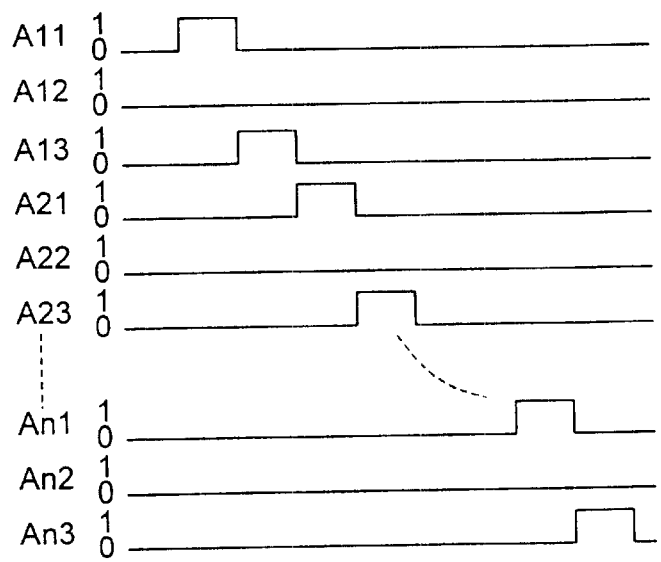
FIG. 14A is a timing chart showing the operation of the image sensor in a high resolution mode and FIG. 14B is a timing chart showing the operation thereof in a low resolution mode.
Figure 14B:
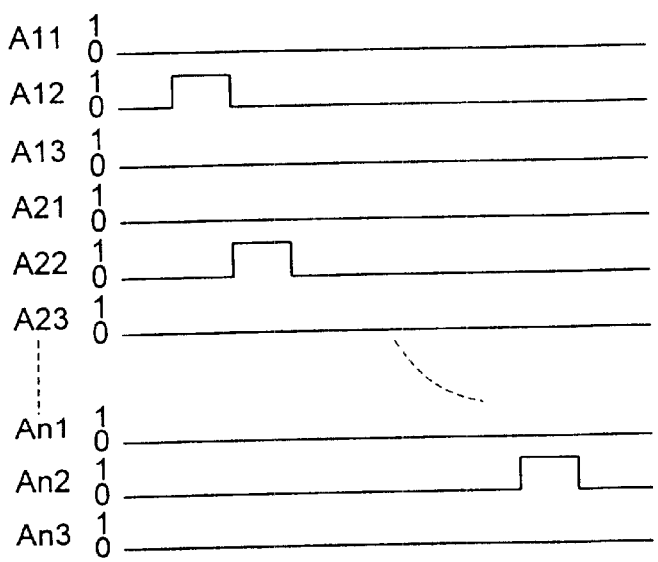

Next, description will be given to the operation of the image sensor constituted as stated above in the first embodiment. FIG. 14A is a timing chart showing the operation of the image sensor in a high resolution mode. FIG. 14B is a timing chart showing the operation of the image sensor in a low resolution mode.

If images are read in the high resolution mode, the outputs A11, A13, A21, A23, ..., An1 and An3 of the driver circuit 5 are sequentially turned on and off as shown in FIG. 14A. As a result, the charges of stored signals of the light receiving elements D11, D13, ..., D21, D23, ..., Dn1, Dn3 for 400 dpi resolution are outputted to the common readout wiring 8 in a time series manner.

The outputted charges are converted to voltage signals by a detection circuit such as an integrator connected to the common readout wiring.

If images are read in the low resolution mode, by contrast, the outputs A12, A22, ..., An2 of the driver circuit are sequentially turned on and off as shown in FIG. 14B. As a result, the charges of the stored signals of the light receiving elements D12, D22, ..., Dn2 for 200 dpi resolution are outputted to the common readout wiring 8 in a time series manner.

Figure 15:
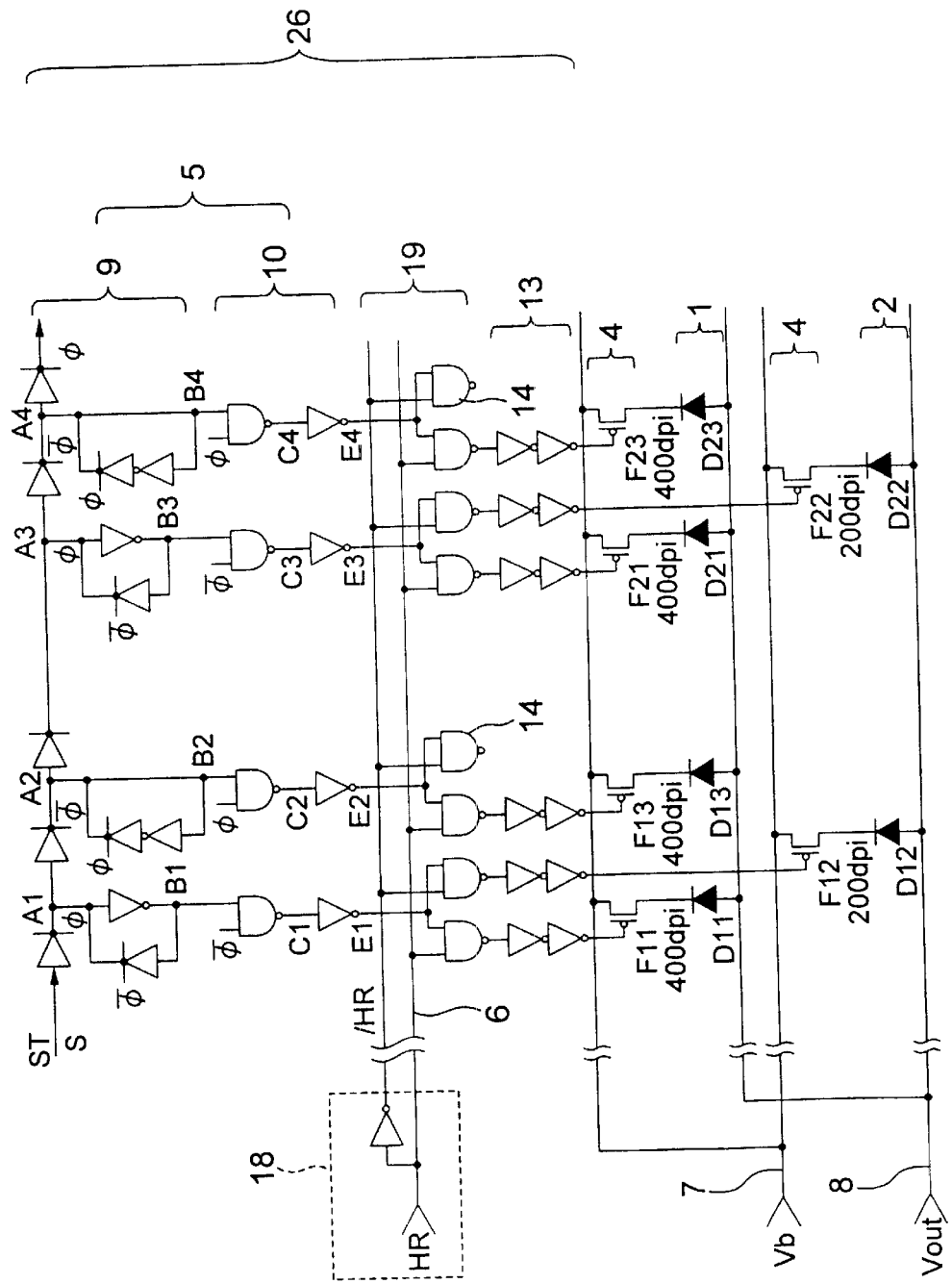
FIG. 15 is a circuit diagram embodying the block diagram of FIG. 13.
Figure 16A:
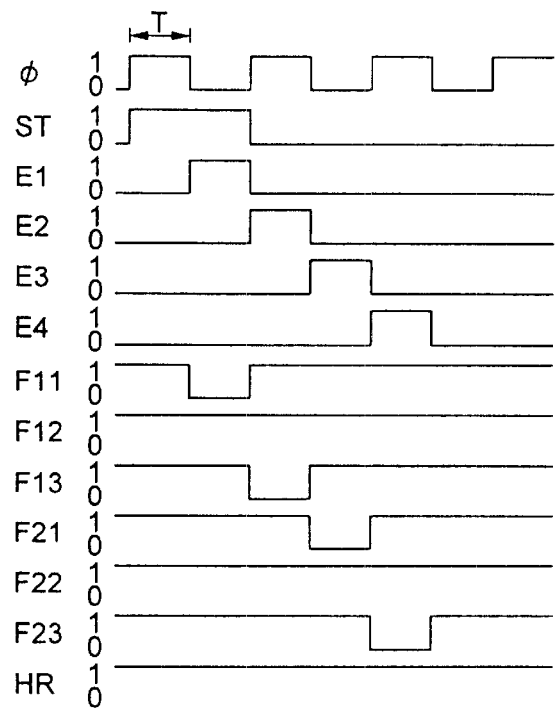
FIG. 16A is a timing chart showing the operation of the image sensor shown in FIG. 15 in a high resolution mode and FIG. 16B is a timing chart showing the operation thereof in a low resolution mode.
Figure 16B:
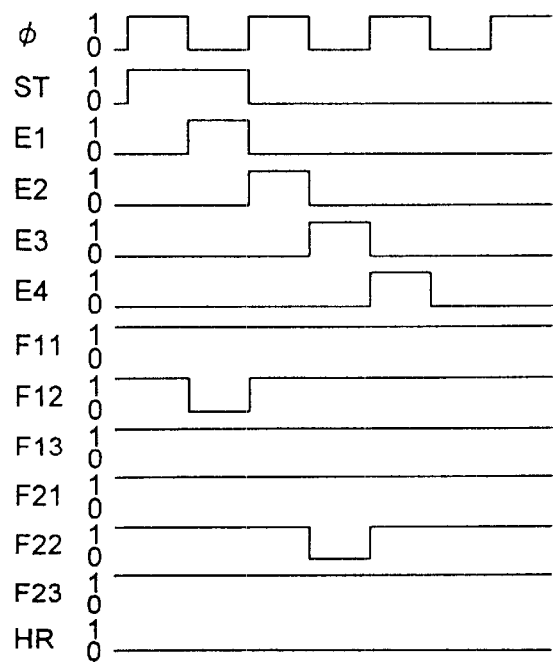

FIG. 15 is a circuit diagram embodying the block diagram shown in FIG. 13. FIG. 16A is a timing chart showing the operation of the image sensor shown in FIG. 15 in the high resolution mode. FIG. 16B is a timing chart showing the operation of the image sensor shown in FIG. 15 in the low resolution mode.

This image sensor is a close-contact type line image sensor which can select one of the two types of resolutions (400 dpi and 200 dpi).

FIG. 15 shows two photodiodes D12 and D22 for 200 dpi resolution serving as light receiving elements which are constituents of the second light receiving array 2 and also shows four photodiodes D11, D13, D21 and D23 for 400 dpi resolution serving as light receiving elements which are constituents of the first light receiving element array 1. It is noted that the number of photodiodes should not be limited thereto.

In the image sensor 3, the driver circuit 5, pixel switches 4 and the light receiving element arrays 1 and 2 are formed on a single glass substrate.

The driver circuit 5 and the pixel switches 4 are formed by using polycrystalline silicon transistors, respectively. The pitch and size of the photodiodes are the same as those described above. Namely, the shape of a photodiode for 400 dpi resolution is a square having equal sides of 50 $\mu$m in length and the pitch of the photodiodes is 63.5 $\mu$m. The shape of a photodiode for 200 dpi resolution is a square having equal sides of 100 $\mu$m in length and the pitch of the photodiodes is 127 $\mu$m.

The photodiode array for 200 dpi resolution and that for 400 dpi resolution are laid out in parallel.

The cathode electrode of each of the photodiodes is connected to the bias line 7 through a corresponding pixel switch 4. A voltage of 5V corresponding to the reverse bias of the photodiode is applied to the common bias line 7 through a connection pad from outside of the substrate. The anode electrode thereof is connected to the common readout wiring 8.

The driver circuit 5 is provided with shift registers 9 and shift register output circuits 10 shaping and outputting the signals of the respective stages of the shift registers.

The image sensor 3 is also provided with a light receiving element array selection control circuit 18 selecting one of the light receiving arrays and switching over resolution. A control line HR for switching over resolution and a control line /HR, to which the signal of the control line HR is inverted by an inverter and transmitted, are connected to the light receiving element array selection control circuit 18.

The image sensor 3 is further provided with a decoder circuit 19 including a plurality of two-input NAND circuits 14 inputting the output signals of the shift register output circuits 10 and the output signals of either the control line HR or /HR. The image sensor 3 is also provided with a buffer circuits 13 inputting the output signals of the NAND circuits 14 and connected to the pixel switch 4, respectively.

In this embodiment, the decoder circuit 19 includes the NAND circuits 14; however, the circuit 19 may include NOR circuits. Further, the shift registers 9 and shift register output circuits 10 in this embodiment are special circuits each characterized by high speed and a small area; however, well-known shift registers may replace them.

Moreover, P-type transistors are used for the pixel switches 4 in this embodiment; however, P-type transistors or N-type transistors can be appropriately selected based on the operating conditions of the pixel switch transistors determined by the power of the driver circuit and by the reverse bias voltages of the photodiodes. In that case, the number of stages of the buffer circuits needs to be changed.

Next, the method of driving the image sensor shown in FIG. 15 will be described with reference to FIGS. 16A and 16B.

If a scanning start signal ST is inputted as the input signal of the shift registers, scanning signals are sequentially inputted to the shift register output circuits E1, E2, E3, E4, . . . while the scanning signals are delayed by a cycle T which is half the cycle of a clock signal ø, respectively.

If the sensor is employed for 400 dpi resolution, a resolution switching signal HR is fixed to level "1" as shown in FIG. 16A. As is obvious from FIG. 15, if the resolution switching signal HR is "1", only the switches F11, F13, F21 and F23 connected to the photodiodes for 400 dpi resolution are turned on/off at timing shown in FIG. 16A, whereas the switches F12 and F22 connected to the photodiodes for 200 dpi resolution remain off.

Therefore, the charges stored in the photodiodes for 400 dpi resolution are sequentially outputted to the common readout line 8 at every cycle T which is half the cycle of the clock signal ø in a time series manner. At the same time, the photodiodes are reset.

If the sensor is employed for 200 dpi resolution, the resolution switching signal HR is fixed to level "0" as shown in FIG. 16B. As is obvious from FIG. 15, if the resolution switching signal HR is "0", only the switches F12 and F22 connected to the photodiodes for 200 dpi resolution are turned on/off at timing shown in FIG. 16B, whereas the switched F11, F13, F21 and F23 connected to the photodiodes for 400 dpi resolution remain off.

Therefore, the charges stored in the photodiodes for 200 dpi resolution are sequentially outputted to the common readout wiring 8 at every cycle (2×T) of the clock signal ø in a time series manner.

The NAND circuits 14 whose output signals are not used are provided with a view to making the loads of the output circuits E1, E2, E3 and E4 in the shift register circuit equal to one another and to making delays of the outputs from the clock signal equal to one another.

The number of pads of the image sensor of resolution switching type constituted as stated above increases only by 1 from that of a conventional image sensor of single resolution type since only one pad for resolution switching control is added to the image sensor in this embodiment.

In addition, since only simple decoder is added to the driver circuit 5 formed on the image sensor substrate 25, the increase of chip area is small and the possibility of lowering yield is small, as well. In actuality, as a result of manufacturing and comparing the resolution switching type image sensor shown in FIG. 15 and the conventional image sensor of single resolution (400 dpi) type, it was found that the chip area for the image sensor shown in FIG. 15 was only less than 1.5 times as large as that for the conventional sensor and the yield of the sensor shown in FIG. 15 was equivalent to that of the conventional sensor.

Furthermore, to switch over resolution, the HR may be fixed to either "1" or "0", thereby facilitating designing a driver circuit. Besides, an external circuit can be easily formed.

Figure 1:
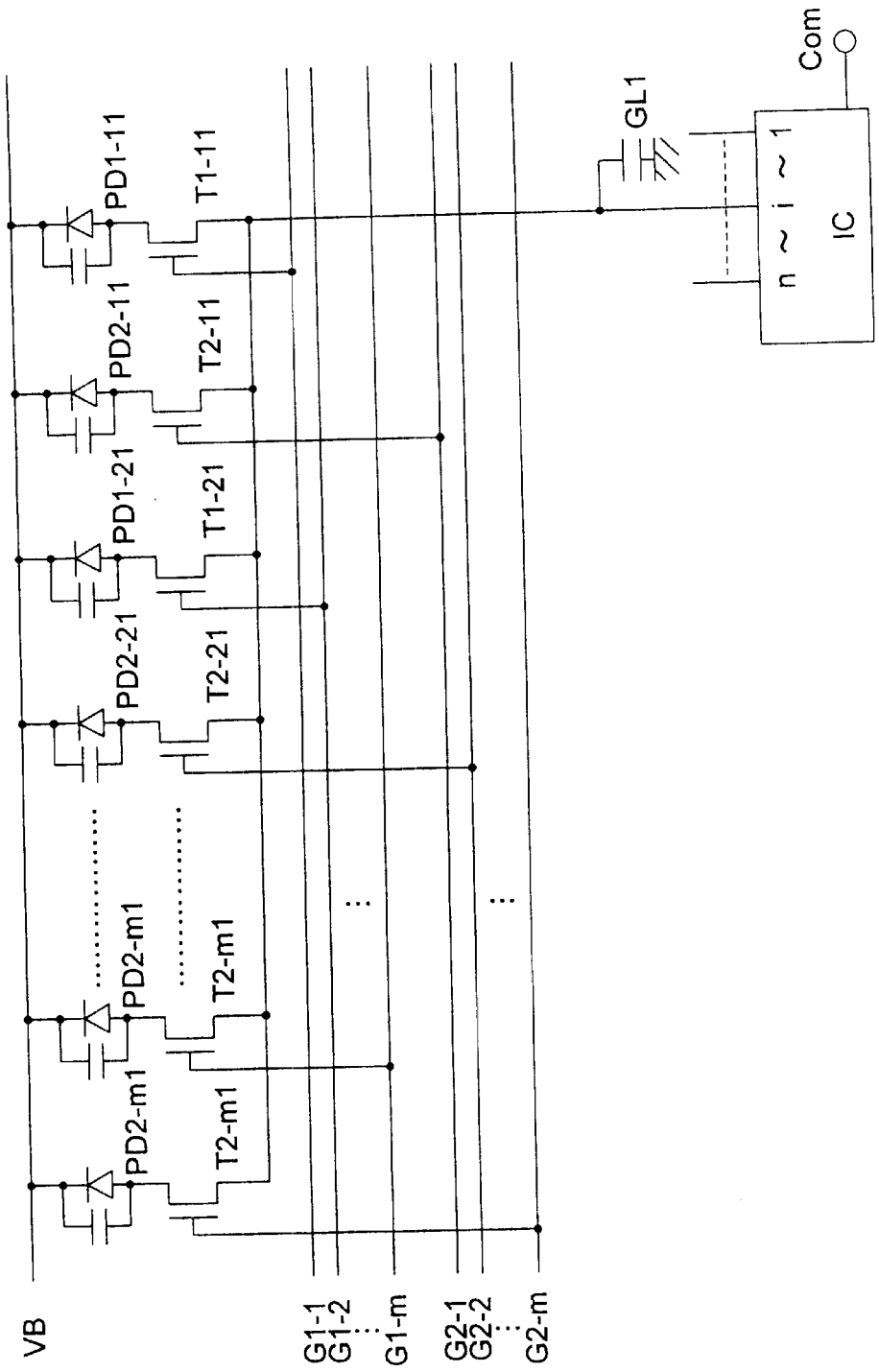
FIG. 1 is a circuit diagram showing the structure of a conventional image reader disclosed by Japanese Patent Application Laid-Open No. 6-276365.
Figure 2A:
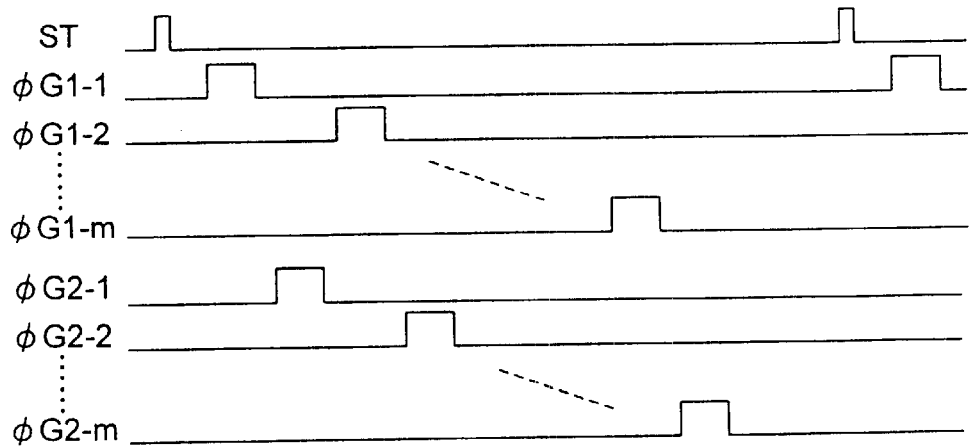
FIGS. 2A and 2B are timing charts showing the operation of the image reader shown in FIG. 1.
Figure 2B:
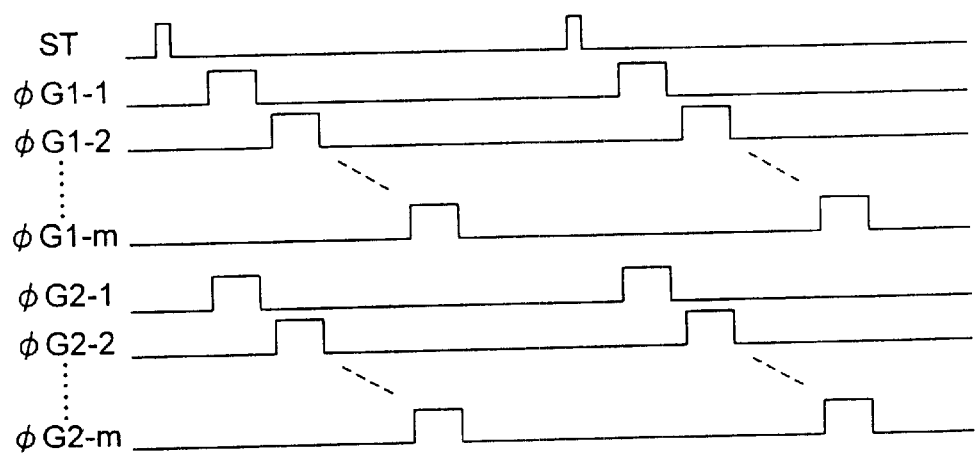
Figure 3:
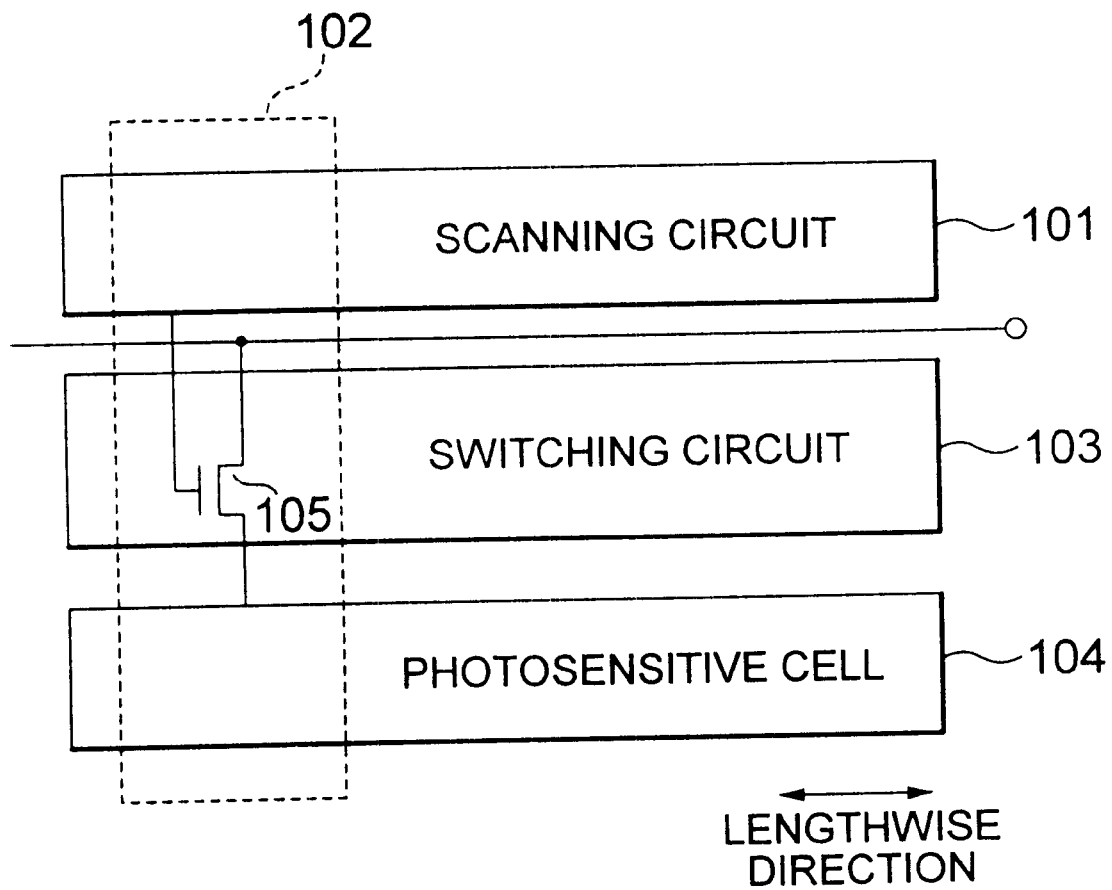
FIG. 3 is a block diagram showing a conventional image sensor disclosed by Japanese Patent Application Laid-Open No. 60-22881.
Figure 4:
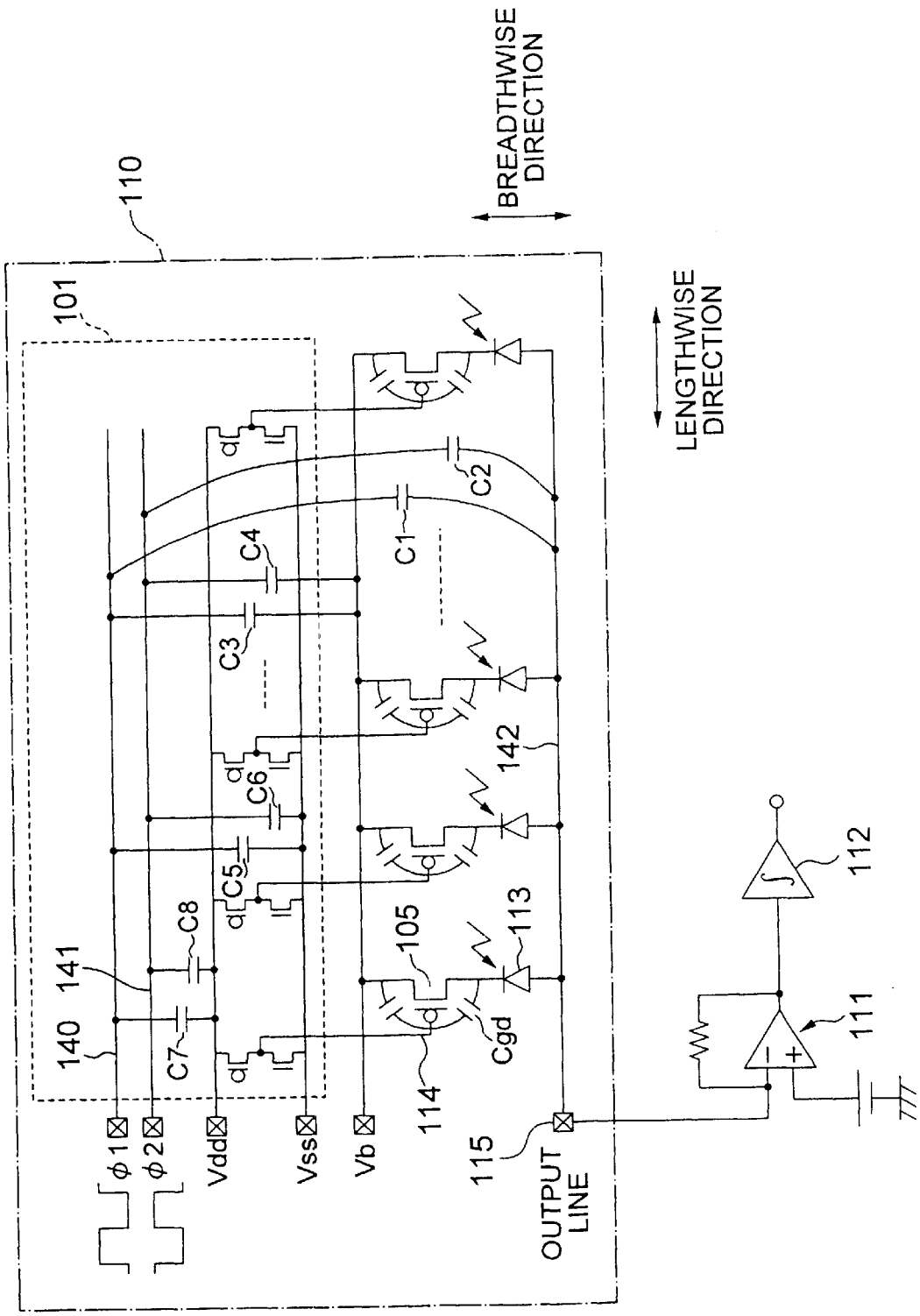
FIG. 4 is a block diagram showing the structure of an image sensor manufactured by the inventor of the present invention as a trial.
Figure 5:
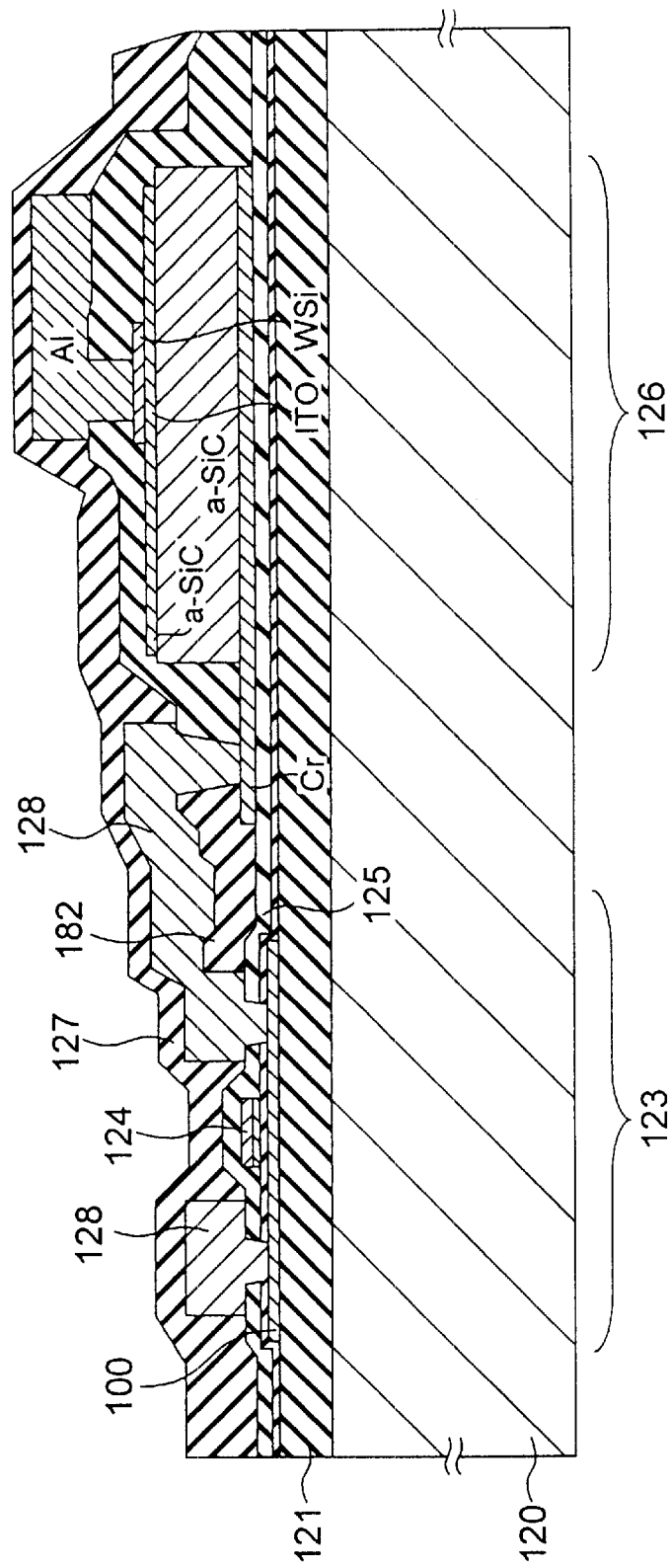
FIG. 5 is a cross-sectional view showing the structure of the image sensor manufactured by the inventor of the present invention as a trial.
Figure 6:
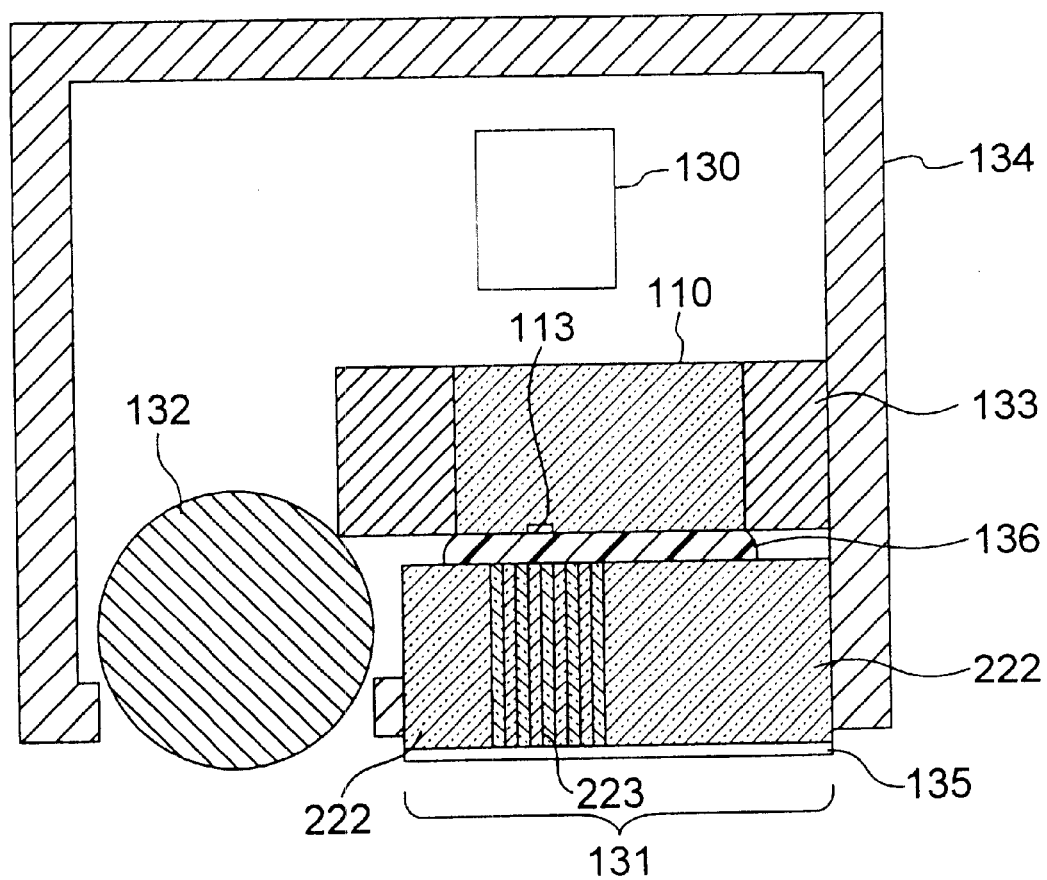
FIG. 6 is a typically cross-sectional view showing an image sensor module assembled by the inventor of the present invention.
Figure 7:
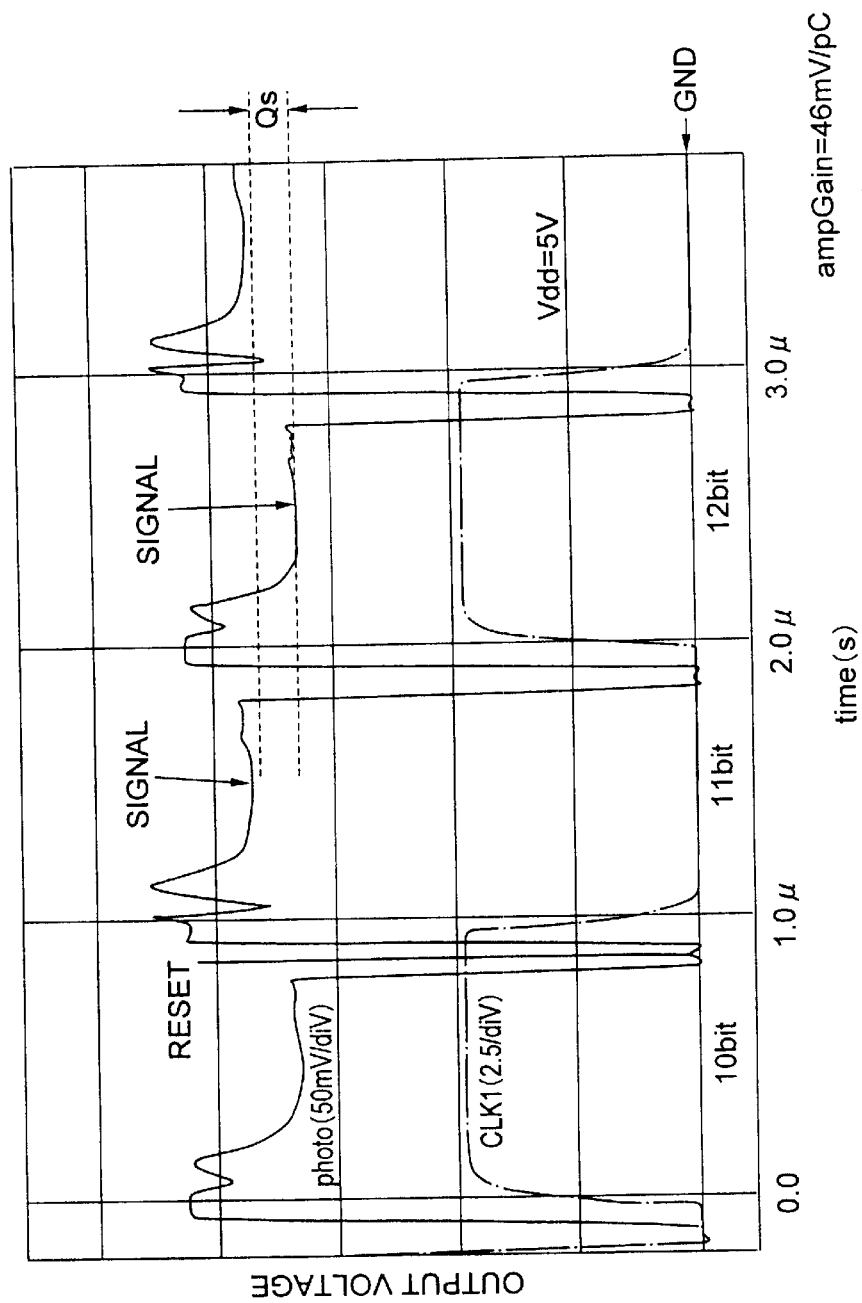
FIG. 7 is a graph showing output signal waveforms of the image sensor.
Figure 8:
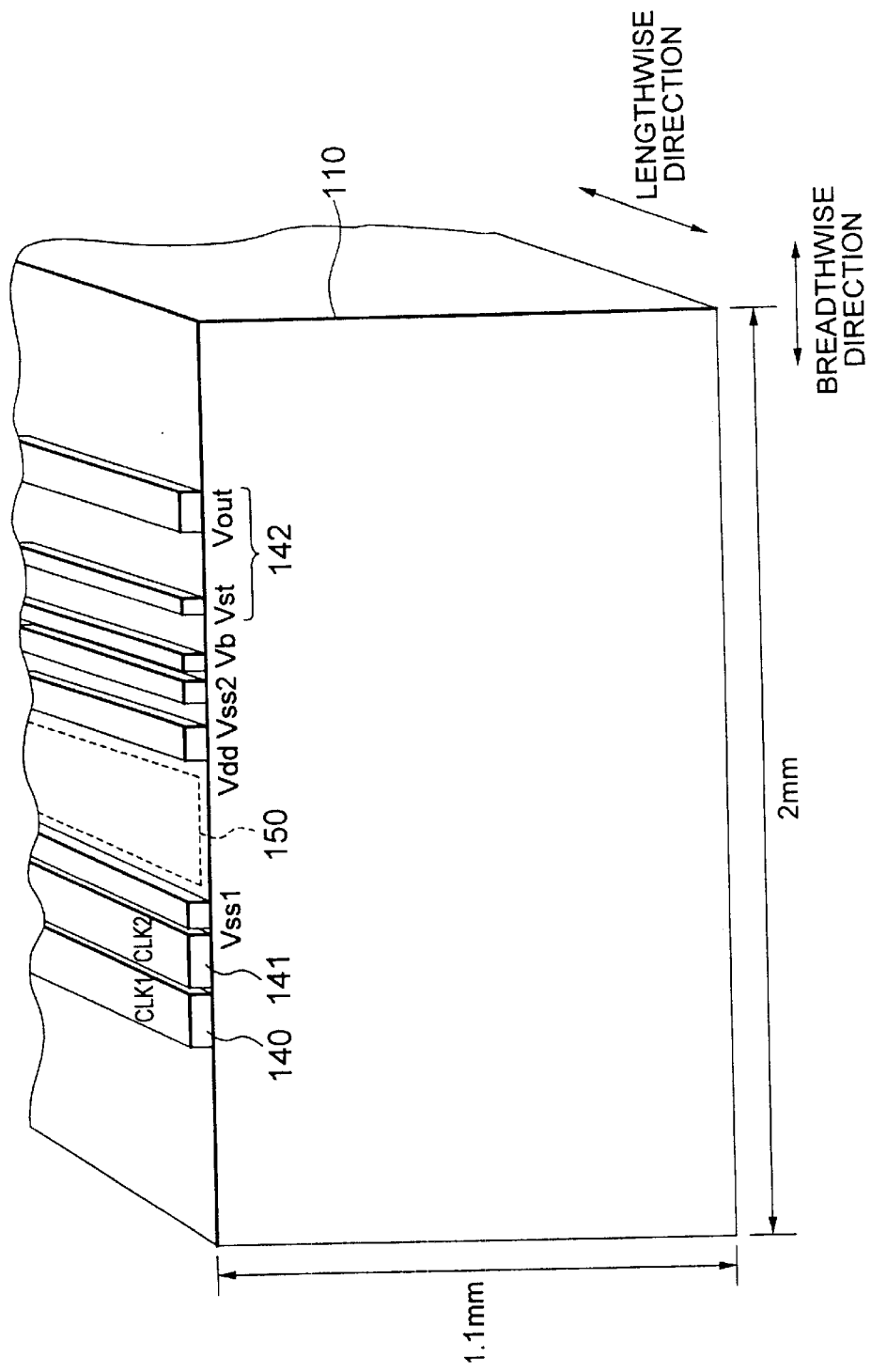
FIG. 8 is a typically perspective view showing the layout of wirings on the image sensor shown in FIG. 4.
Figure 9:
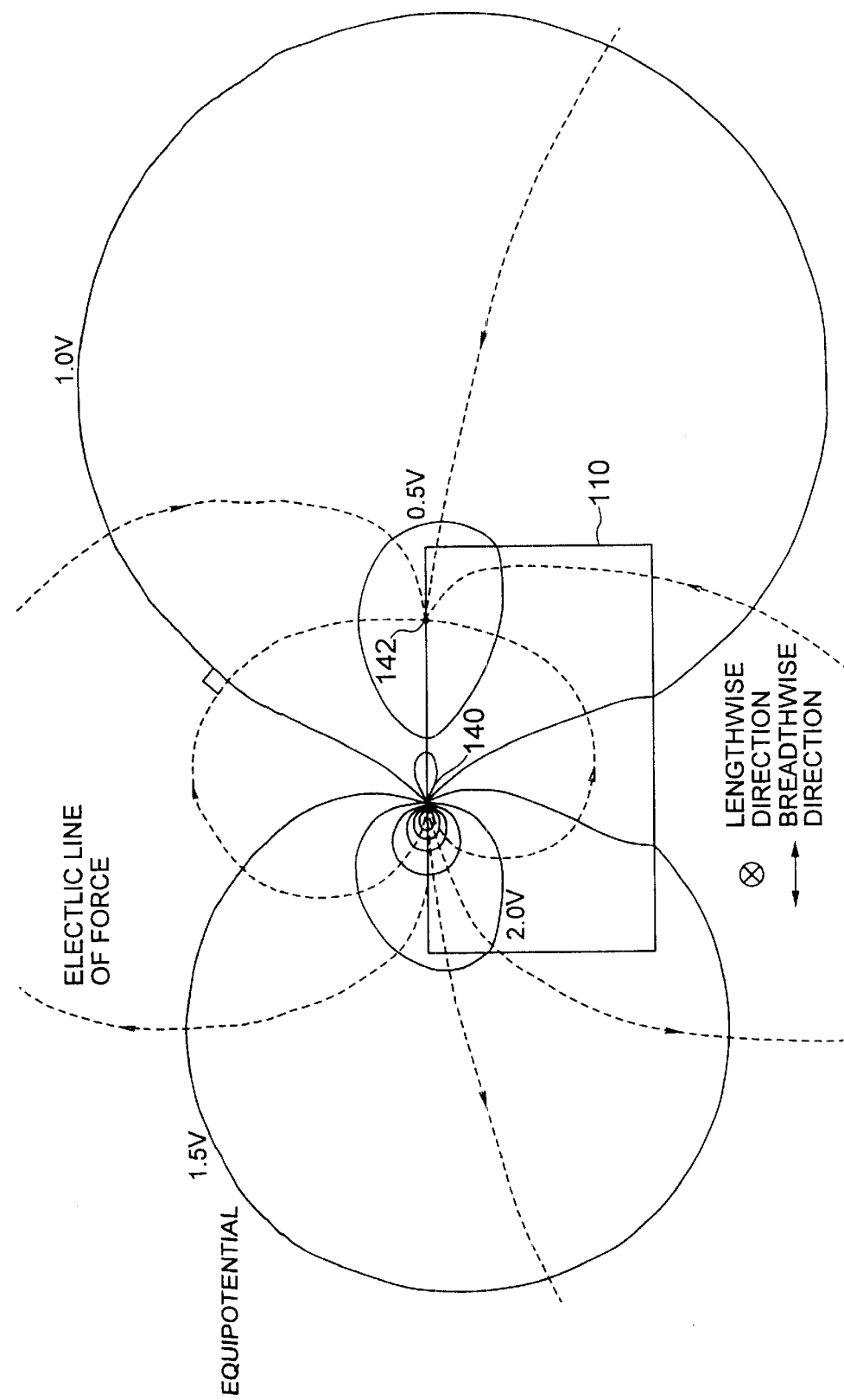
FIG. 9 shows the equipotential and the electric force of line resulting from the parasitic capacitances present between a clock 1 wiring and an output wiring if the image sensor is floated in the air.
Figure 10:
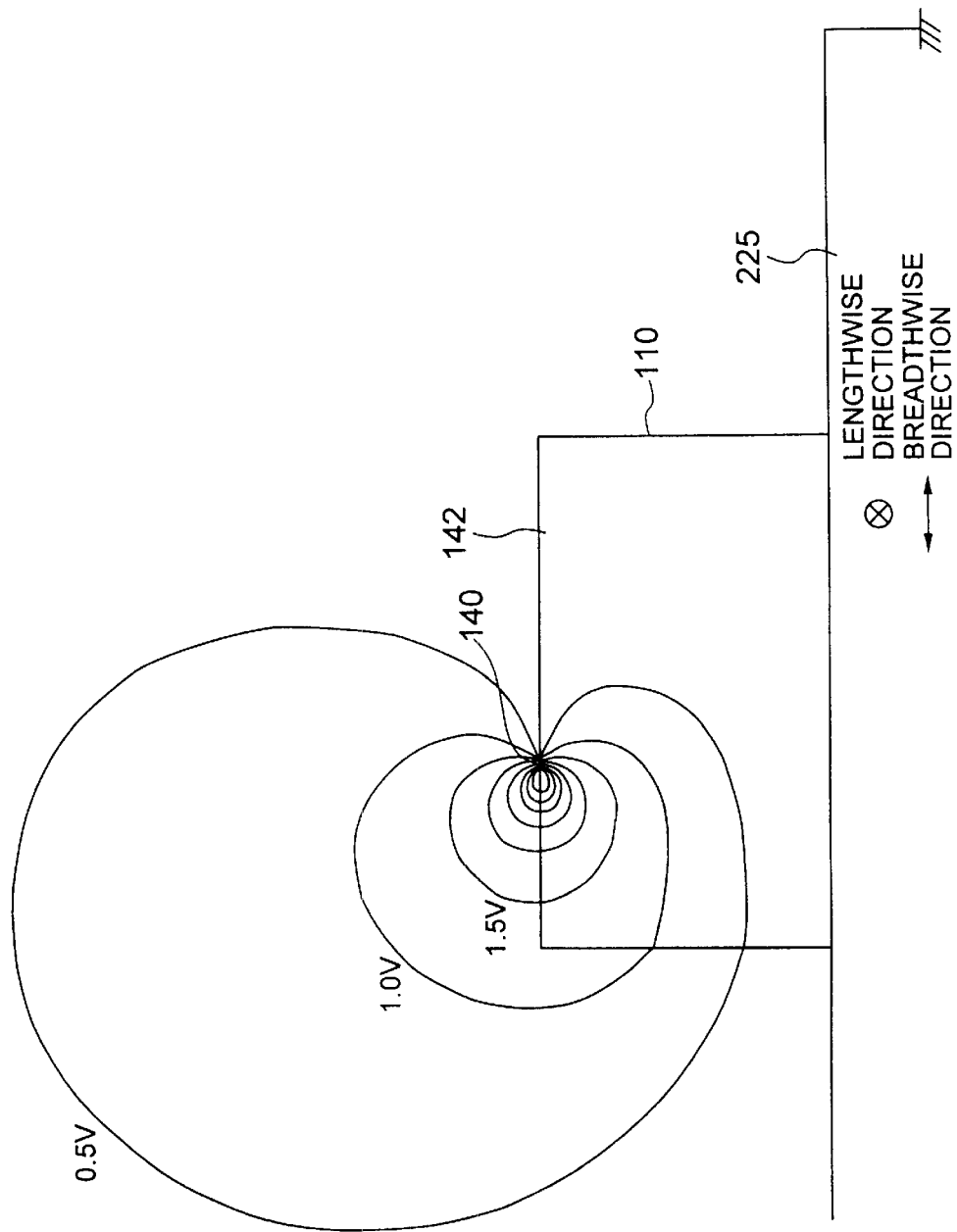
FIG. 10 shows the equipotential resulting from the parasitic capacitances present between the clock 1 wiring and the output wiring if a ground metal plate is arranged on the back side of the image sensor shown in FIG. 9.
Figure 11:
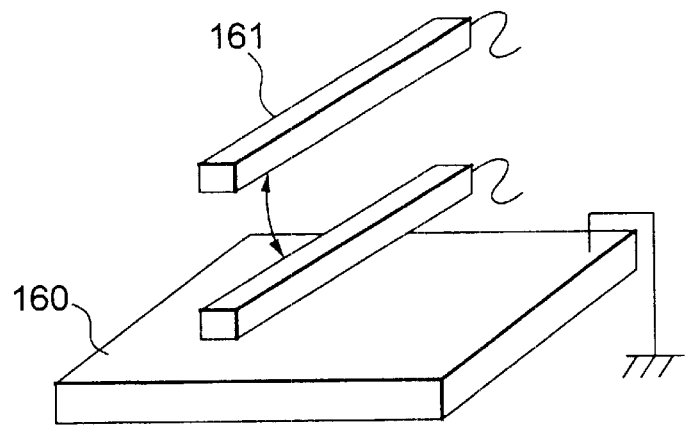
FIG. 11 is a perspective view showing the positional relationship between the ground metal plate and a scanner module.
Figure 12A:
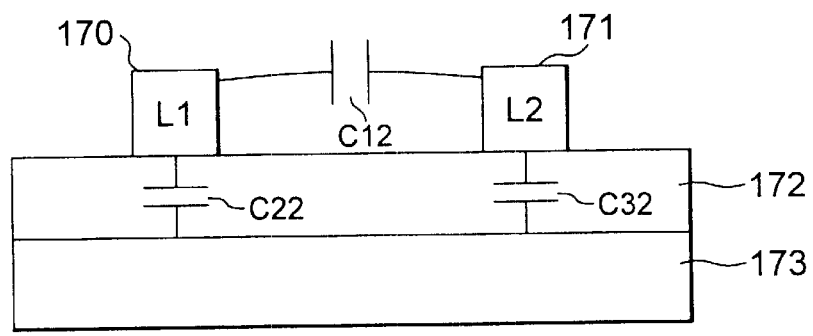
FIG. 12A is a typical view of a model showing that parallel wirings are formed on a silicon substrate and FIG. 12B is a typical view of a model showing that parallel wirings are formed on a glass substrate.
Figure 12B:
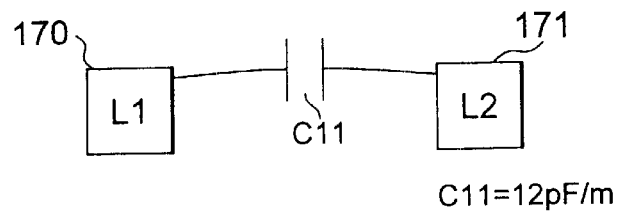

In the conventional resolution switching type image sensor shown in FIG. 1, a plurality of light receiving elements are switched altogether. In this embodiment, by contrast, if signal quantity is to be increased by lowering resolution, only one switch connected to a light receiving element dedicated to low resolution is switched. Owing to this, the mixture of noise derived from switching operation is less frequent to thereby reduce noise.

Next, the second embodiment according to the present invention will be described. The second embodiment differs from the first embodiment in the constitution of a control circuit.

It is normally known that the reading speed of a line image sensor depends on reading time per line. If the reading time is set at t (sec/line), the following formula is established:

$$t = H + B$$

where H is time necessary to scan all the pixels and B is blanking time.

The signal storage time of the storage type sensor as shown in the first embodiment is equal to the reading time t. To increase reading speed, reading time t may be reduced. The lower limit of the reading time is, however, determined by an S/N ratio irrespectively of the above formula. The first embodiment intends to reduce reading time t by increasing signal quantity S during low resolution.

If, however, the reading time t and the time H necessary to scan all pixels are substituted for t and H in the formula, the value of blanking time B sometimes becomes a negative value. The value of the blanking time B must be not less than 0. Thus, the reading speed is limited to the time H for scanning all pixels and the scanning speed needs to be increased.

Figure 17:
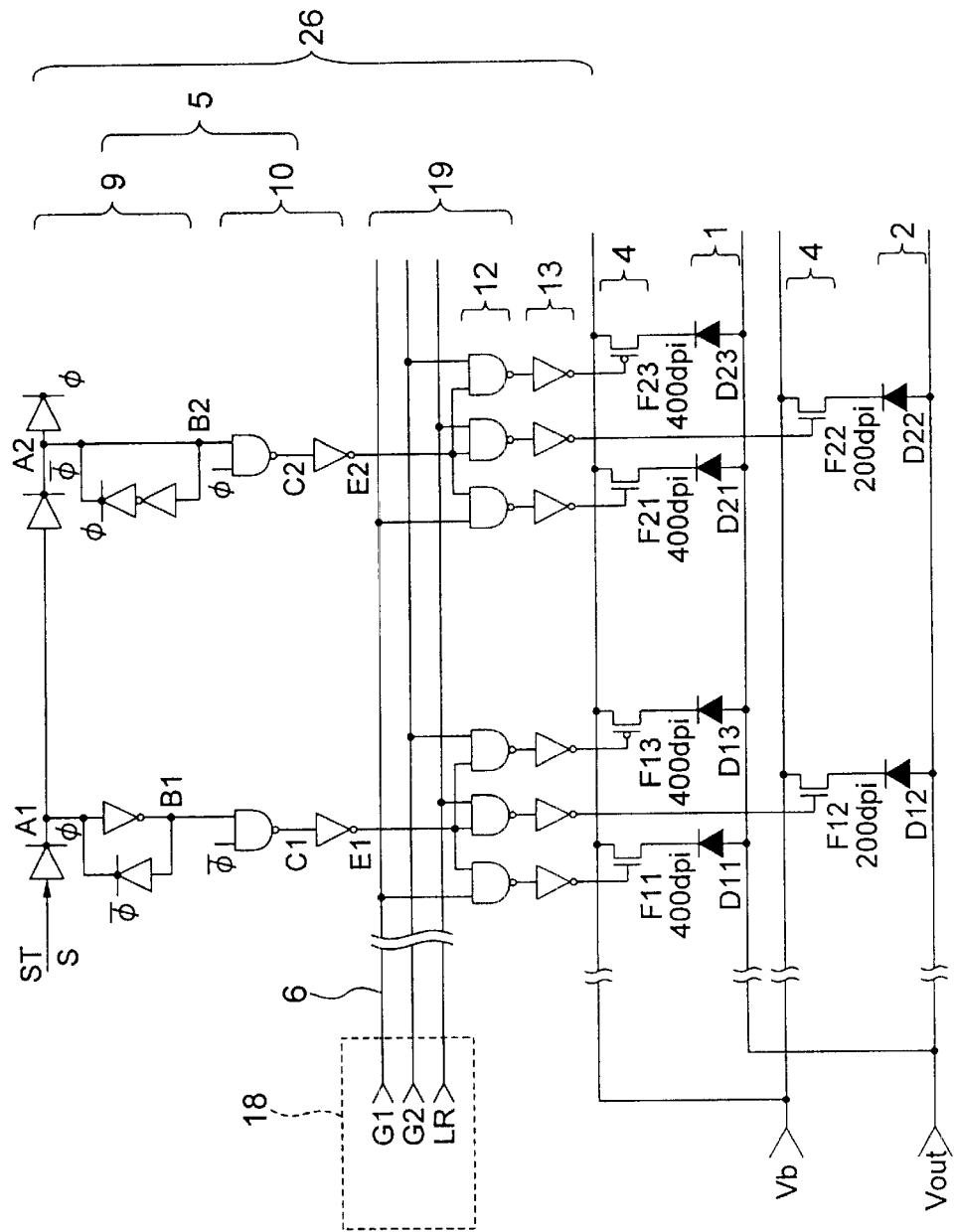
FIG. 17 is a circuit diagram showing the structure of an image sensor in the second embodiment according to the present invention.
Figure 18A:
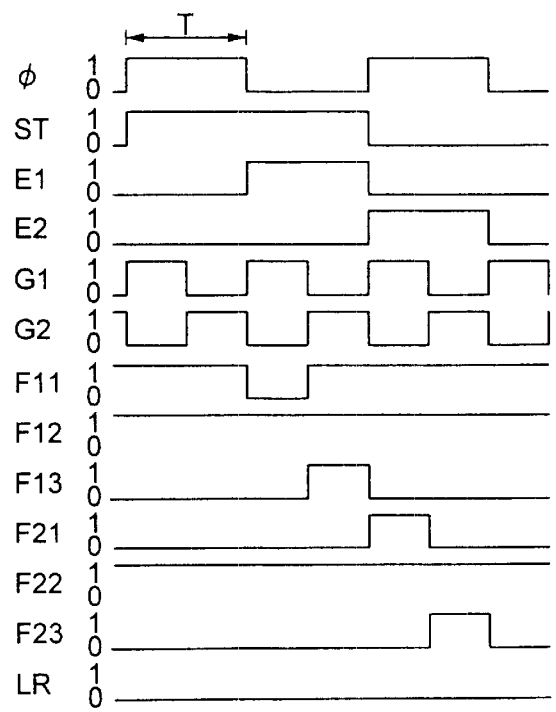
FIG. 18A is a timing chart showing the operation of the image sensor in the second embodiment in a high resolution mode and FIG. 18B is a timing chart showing the operation thereof in a low resolution mode.
Figure 18B:
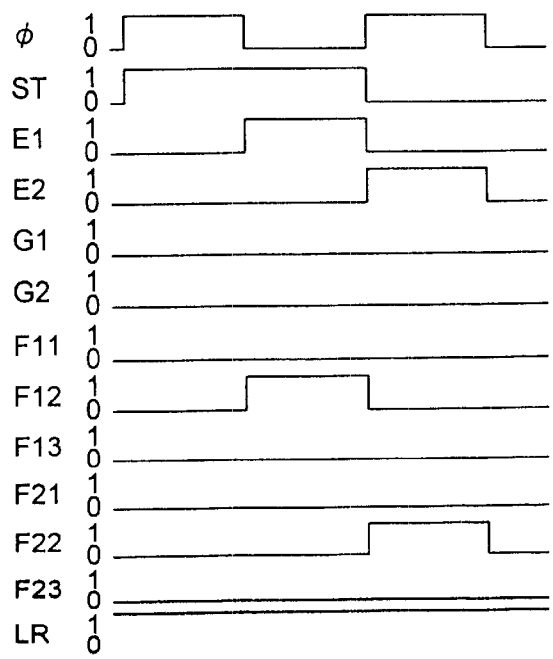

Considering the above, the second embodiment is designed to reduce reading time by increasing scanning time. FIG. 17 is a circuit diagram showing the structure of an image sensor in the second embodiment according to the present invention. FIG. 18A is a timing chart showing the operation of the image sensor in the second embodiment in a high resolution mode. FIG. 18B is a timing chart showing the operation of the image sensor in the second embodiment in a low resolution mode. It is noted that the same constituent elements in the second embodiment shown in FIGS. 17, 18A and 18B as those in the first embodiment shown in FIGS. 15, 16A and 16B are denoted by the same reference symbols and the detailed description of those elements will not be given herein.

In the image sensor in the second embodiment, the output signals of the respective stages of shift registers 9 are divided by the drive of a control line 6.

In the second embodiment as in the case of the first embodiment, the image sensor is a close-contact type line image sensor which can select one of the two resolutions (200 dpi and 400 dpi). The pitch and size of light receiving elements in light receiving element arrays 1 and 2 are the same as those in the first embodiment. That is, the shape of a photodiode for 200 dpi resolution is a square having equal sides of 100 µm in length and the pitch of the photodiodes is 127 µm. The shape of a photodiode for 400 dpi resolution is a square having equal sides of 50 µm in length and the pitch of the photodiodes is 63.5 µm.

A driver circuit 5 is provided with shift registers 9 and shift register output circuits 10 shaping and outputting the signals of the respective stages of the shift registers.

In the second embodiment, the image sensor is provided with a light receiving element array selection control circuit 18 selecting one of the light receiving arrays and switching over resolution. Three types of control lines 6 are connected to the light receiving element array selection circuit 18.

In the second embodiment, the image sensor is further provided with a decoder circuit 19 consisting of a plurality of two-input NAND circuits 12 inputting the output signals of the shift register output circuits 10, respectively and the output signal of the control line LR, G1 or G2 as the three types of control lines 6. Further, the image sensor is provided with buffer circuits 13 inputting the output signals of the NAND circuits 12 and connected to corresponding pixel switches 4, respectively.

Next, the method of driving the image sensor in the second embodiment will be described with reference to FIGS. 18A and 18B.

As in the case of the first embodiment, if a scanning start signal ST is inputted as the input signal of the shift registers, scanning signals are sequentially outputted to the shift register output circuits E1, E2, . . . while the scanning signals are delayed by a cycle T which is half the cycle of a clock signal ø, respectively.

If the image signal is employed for 400 dpi resolution, a resolution switching signal LR is fixed to level "0" as shown in FIG. 18A and clock signals which do not become level "1" simultaneously, are inputted to the control lines G1 and G2, respectively.

By driving the sensor as stated above, when the output En of the shift register output circuit is "1", the photodiodes D11 and D21 for 400 dpi resolution are selected in the first half of the driving period and D13 and D23 for 400 dpi resolution are selected in the second half thereof. Therefore, if the time H for scanning all pixels is controlled by the shift time of the respective stages of the shift registers, two pixels are scanned per shift register and the reading speed is doubled in this embodiment.

If the sensor is employed for 200 dpi resolution, by contrast, the resolution switching signal LR is fixed to level "1" and the control lines G1 and G2 are fixed to level "0" as shown in FIG. 18B. By driving the sensor as stated above, when the output En of the shift register output circuit is "1", only the 200 dpi pixels are selected.

In the second embodiment as in the case of the first embodiment, if signal quantity is to be increased by lowering resolution, only one switch connected to a light receiving elements dedicated to low resolution is switched. Therefore, the mixture of noise deriving from the switching operation is less frequent and noise is, therefore, reduced.

Figure 19:
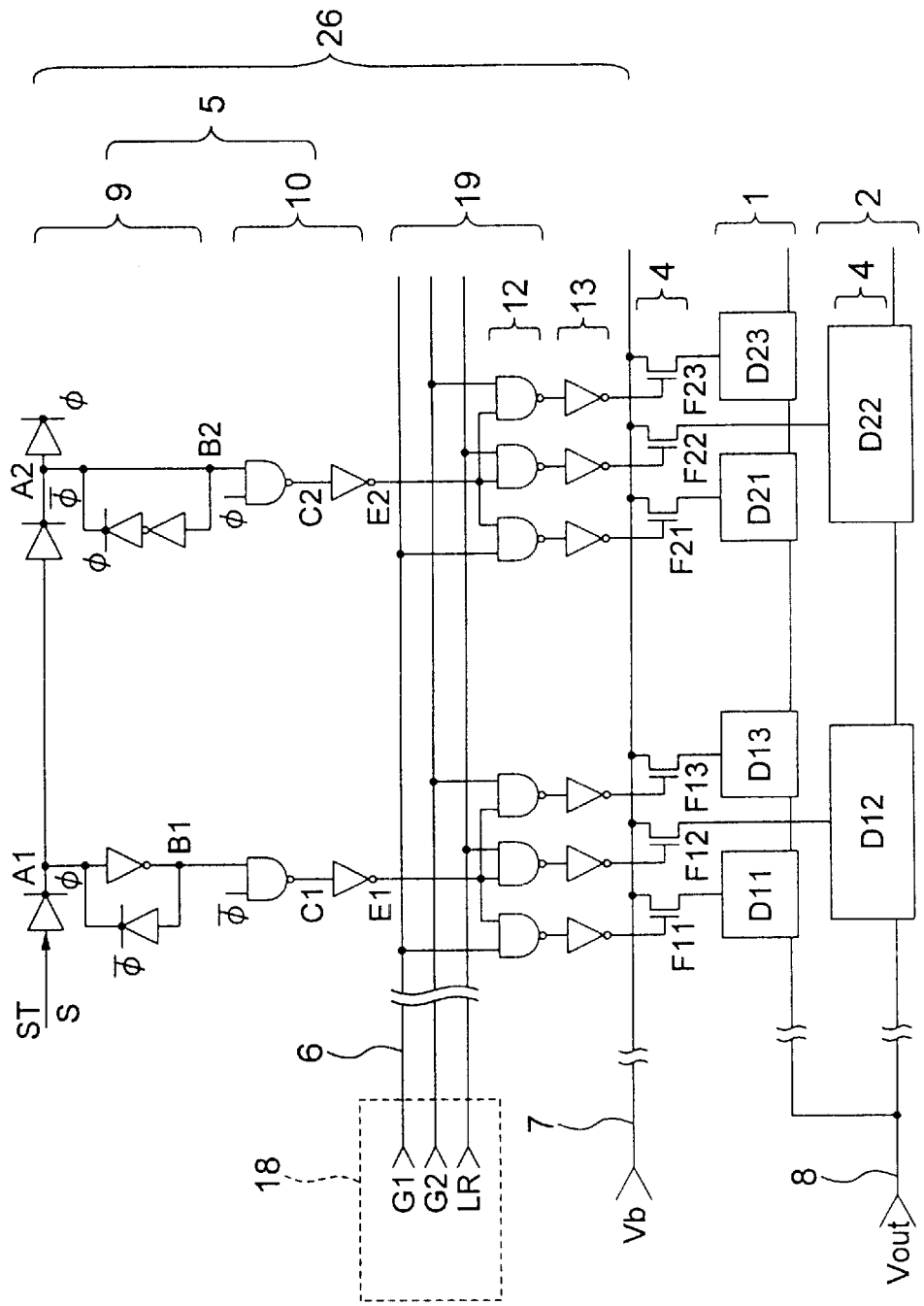
FIG. 19 is a circuit diagram showing the structure of an image sensor in the third embodiment according to the present invention.
Figure 20A:
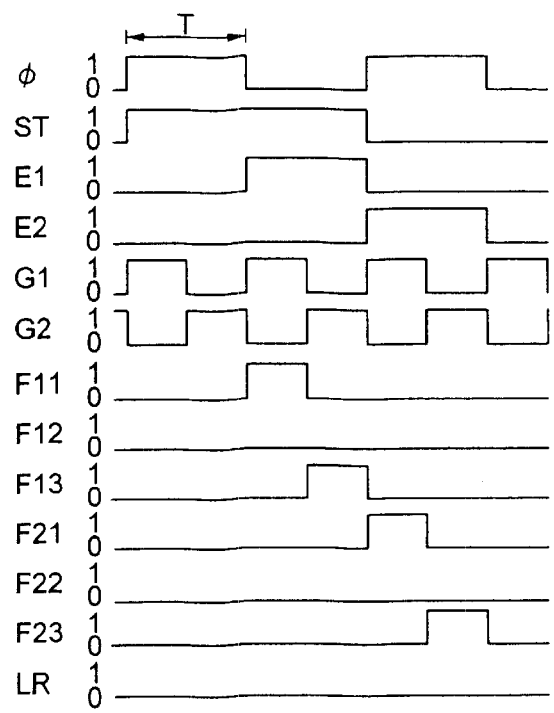
FIG. 20A is a timing chart showing the operation of the image sensor in the third embodiment in a high resolution mode and FIG. 20B is a timing chart showing the operation thereof in a low resolution mode.
Figure 20B:
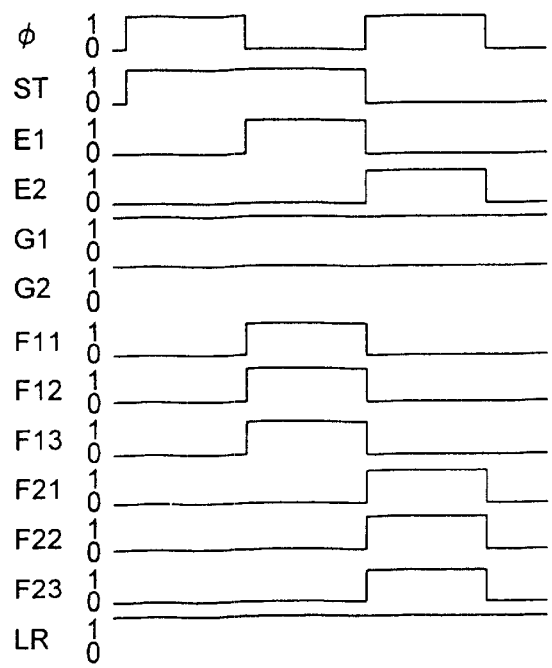

Next, the third embodiment according to the present invention will be described. In the third embodiment, a plurality of pixels are simultaneously selected when low resolution is selected. FIG. 19 is a circuit diagram showing the structure of an image sensor in the third embodiment. FIG. 20A is a timing chart showing the operation of the image sensor in the third embodiment in a high resolution mode. FIG. 20B is a timing chart showing the operation of the image sensor in the third embodiment in a low resolution mode. It is noted that the same constituent elements in the third embodiment as shown in FIGS. 19, 20A and 20B as those in the second embodiment as shown in FIGS. 17, 18A and 18B are denoted by the same reference symbols, which detailed description will not be given herein.

The image sensor in the third embodiment is, as in the case of the preceding embodiments, a close-contact type image sensor which can select one of the two types of resolutions (200 dpi and 400 dpi). The differences of the third embodiment from the second embodiment are that the sizes of the light receiving elements D12 and D22 for 200 dpi resolution which are the constituent elements of a light receiving array 2 are larger than those in the first embodiment in main scanning direction, every other pitch of light receiving elements which are the constituent elements of the light receiving element array 1 for 400 dpi resolution is twice as long as that in the first embodiment and that the pitch of the light receiving elements for 200 dpi resolution is twice as long as that in the first embodiment accordingly.

A driver circuit 5 is provided with shift registers 9 and shift register output circuits 10 shaping and outputting the signals of the respective stages of the shift registers 9. Three types of control lines 6 are connected to a light receiving element array selection control circuit 18.

In the third embodiment as in the case of the preceding embodiments, the image sensor is provided with a decoder circuit 19 including a plurality of two-input NAND circuits 12 inputting the output signals of the shift register output circuits 10 and the output signal of the control lines LR, G1 or G2 as the three control lines, respectively. Further, the image sensor is provided with buffer circuits 13 inputting the output signals of the NAND circuits 12 and connected to the pixel switches 4, respectively.

Next, the method of driving the image sensor in the third embodiment will be described with reference to FIGS. 20A and 20B.

As in the case of the first and second embodiments, if a scanning start signal ST is inputted as input signals of the shift registers, scanning signals are sequentially outputted to the shift register output circuits E1, E2, . . . while the scanning signals are delayed by a cycle T which is half the cycle of a clock signal ø, respectively.

If the sensor is employed for 400 dpi resolution, a resolution switching signal LR is fixed to level "0" and clock signals which do not become level "1" simultaneously, are inputted to the control lines G1 and G2, respectively as shown in FIG. 20A.

By driving the image sensor as stated above, when the output En of the shift register output circuit is "1", the light receiving elements D11 and D12 for 400 dpi resolution are selected in the first half of the driving period and D13 and D23 for 400 dpi resolution are selected in the second half thereof.

If the sensor is employed for 200 dpi resolution, by contrast, the resolution switching signal LR and the control lines G1 and G2 are fixed to level "1" as shown in FIG. 20B. By driving the image sensor as stated above, when the output En of the shift register output circuit are "1", all of the switches F11, F12, F13, F21, F22 and F23 are selected simultaneously and the signals of the all of the light receiving elements D11, D12, D13, D21, D22 and D23 are outputted simultaneously to the common output wiring 8.

The light receiving area of the light receiving elements when 200 dpi resolution is selected is substantially four times as large as that of the light receiving elements when 400 dpi resolution is selected, as in the case of the first and second embodiments.

If the light receiving elements D12 and D22, switches 4 controlling the elements D12 and D22, respectively, the NAND circuits 12 and control line LR are removed from the circuit shown in FIG. 19, the resultant constitution is the same as that of a single resolution type image sensor.

With the single resolution image sensor of this type, as already stated above, two pixels can be scanned for each stage of a shift register, thereby increasing reading speed. Thus, by increasing the number of drive control lines and increasing the number of pixels allotted per shift register stage, a higher-speed image sensor can be provided. Moreover, with this constitution, the number of bits of the shift registers is small compared to that of the light receiving elements, yield enhances.

Further, in designing the layout of the light receiving elements, if they are arranged in a row irrespectively of the type of the light receiving array, it is possible to prevent a chip size in vertical direction from increasing. In case of a close-contact type image sensor, in particular, equal multiple image-formation is adopted. Therefore, an allowance for the layout in horizontal direction is given and the image sensor of this type can be easily realized.

Moreover, if a polycrystalline silicon transistor is formed by a laser annealing method while the switches are laid out in a row, switches having uniform characteristics can be advantageously easily obtained.

Next, the fourth embodiment according to the present invention will be described. In the first to third embodiments, the driving of pixel switches connected to the light receiving elements is controlled to switch over outputted signals, thereby switching over resolution. It is also possible to switch over resolution by switching over a common output wiring. It is further possible to conduct the two switching operations simultaneously. In the fourth embodiment, readout wirings are separated for each size of light receiving elements, to thereby switch over resolutions.

Figure 21:
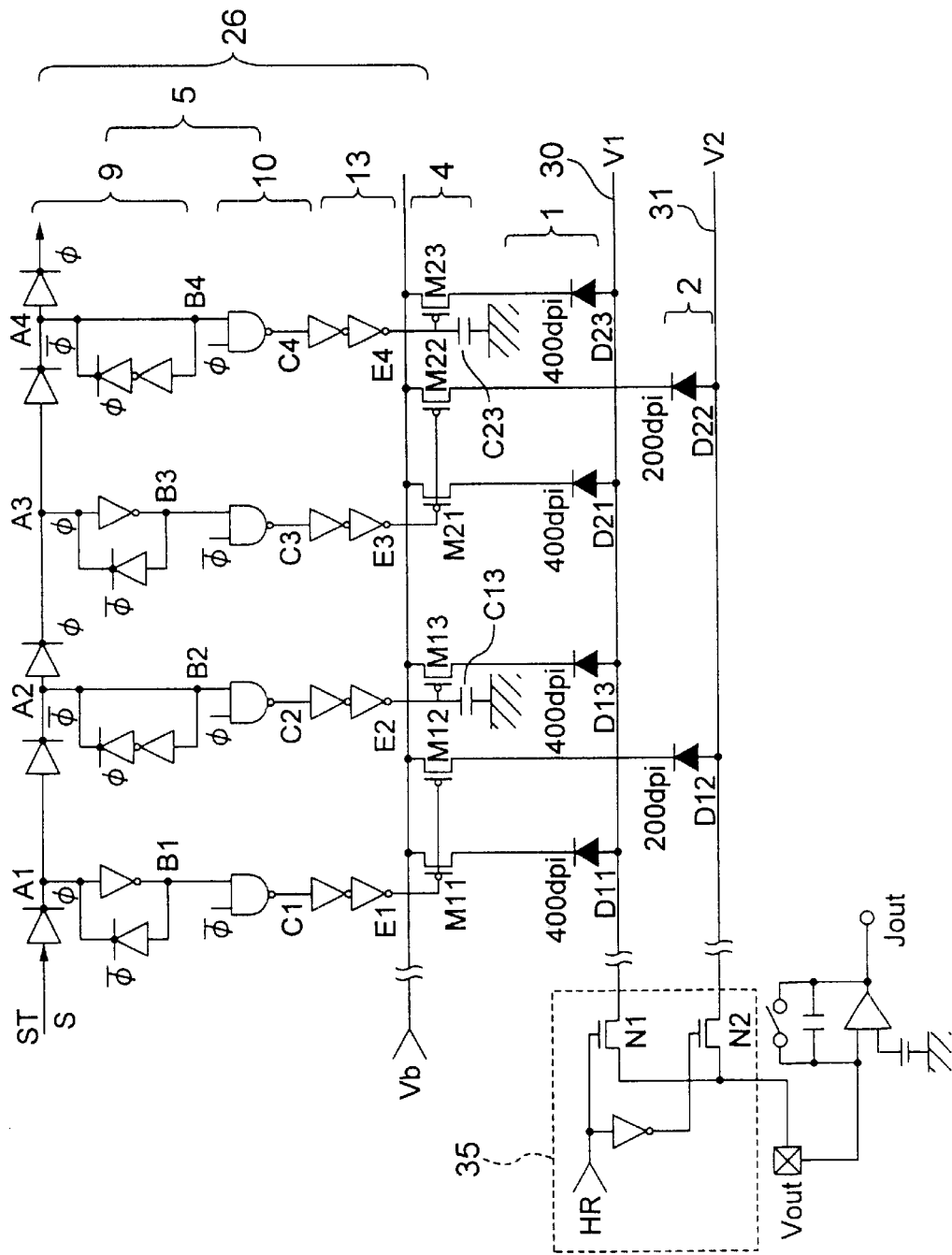
FIG. 21 is a circuit diagram showing the structure of an image sensor in the fourth embodiment according to the present invention.
Figure 22A:
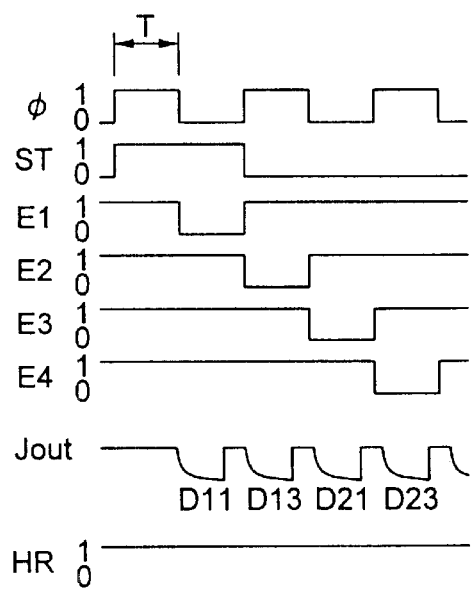
FIG. 22A is a timing chart showing the operation of the image sensor in the fourth embodiment in a high resolution mode and FIG. 22B is a timing chart showing the operation thereof in a low resolution mode.
Figure 22B:
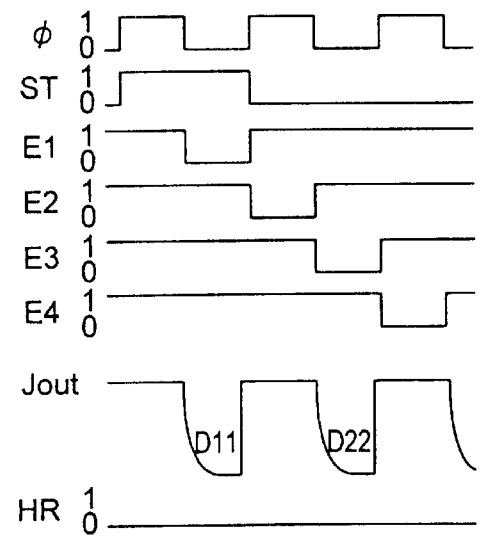

FIG. 21 is a circuit diagram showing the structure of an image sensor in the fourth embodiment according to the present invention. FIG. 22A is a timing chart showing the operation of the image sensor in the fourth embodiment in a high resolution mode. FIG. 22B is a timing chart showing the operation thereof in a low resolution mode. It is noted that the same constituent elements in the fourth embodiment as shown in FIGS. 21, 22A and 22B as those in the first embodiment as shown in FIGS. 15, 16A and 16B are denoted by the same reference symbols, which detailed description will not be given herein.

The image sensor in the fourth embodiment is, as in the case of the first and other embodiments, a close-contact type line image sensor which can select one of the two types of resolutions (200 dpi and 400 dpi). The pitch and size of light receiving elements in light receiving element arrays 1 and 2 are the same as those in the first and other embodiments. That is, the shape of a photodiode for 200 dpi resolution is a square having equal sides of 100 $\mu$m in length and the pitch of the photodiodes is 127 $\mu$m. The shape of a photodiode for 400 dpi resolution is a square having equal sides of 50 $\mu$m in length and the pitch of the photodiodes is 63.5 $\mu$m.

FIG. 21 shows two photodiodes D12 and D22 for 200 dpi resolution and four photodiodes D11, D13, D21 and D23 for 400 dpi. The number of photodiodes should not be limited thereto.

The photodiode array for 200 dpi and that for 400 dpi are laid out in parallel.

The cathode electrode of each of the photodiodes is connected to a common bias line 7 through a corresponding pixel switch 4. A voltage of 5V corresponding to the reverse bias of the photodiode is applied to the common bias line 7 through a connection pad from the outside of a substrate.

The anode electrode of each of the photodiodes D11, D13, D21 and D23 for 400 dpi resolution is connected to a readout wiring V1 and the anode electrode of each of the light receiving elements D12 and D22 for 200 dpi resolution is connected to a readout wiring V2. The readout wirings V1 and V2 are connected to a readout wiring $V_{out}$ through switches N1 and N2, respectively.

A driver circuit 5 is provided with shift registers 9 and shift register output circuits 10 shaping and outputting signals of the respective stages of the shift registers. Buffer circuits 13 having the other ends connected to the switches 4 are connected to the shift register output circuits 10, respectively.

Among the output signals of the buffer circuits, E1, E3, . . . are inputted to both the pixel switches for the light receiving elements for 400 dpi resolution and those for 200 dpi resolution, and E2, E4, . . . are inputted only to the pixel switches for the light receiving elements for 400 dpi resolution.

The load capacitances C13 and C23 due to which the output signals E2, E4, . . . are inputted, are made equal to those of the output signals E1, E3, . . . so that the delays of these signals from a clock signal equal to one another.

Next, the method of driving the image sensor in the fourth embodiment will be described with reference to FIGS. 22A and 22B.

As in the case of the first embodiment, if a scanning start signal ST is inputted to the shift registers, scanning signals are sequentially outputted to the shift register output circuits E1, E2, . . . while the scanning signals are delayed by a cycle T which is half the cycle of clock signal ø, respectively.

If the sensor is employed for 400 dpi resolution, a resolution switching signal HR is fixed to level "1" as shown in FIG. 22A. As a result, a vertical switch N1 is turned on and a vertical switch N2 is turned off, whereby output charge signals from the light receiving elements (D11, D13, D21, D23, . . . ) for 400 dpi resolution are sequentially outputted to the readout wiring $V_{out}$ through the readout wiring V1.

If the charge signals are converted to voltage signals by, for example, an integrating circuit, outputs indicated as $J_{out}$ in FIG. 22A are obtained.

If the sensor is employed for 200 dpi resolution, by contrast, the resolution switching signal HR is fixed to level "0" as shown in FIG. 22B. As a result, the vertical switch N1 is turned off, the vertical switch N2 is turned on and then signals from the light receiving elements (D12, D22, . . . ) for 200 dpi resolution are sequentially outputted to the readout wiring $V_{out}$ through the readout wiring V2.

If the charge signals are converted to voltage signals by, for example, an integrating circuit, outputs indicated as $J_{out}$ shown in FIG. 22B are obtained.

In the fourth embodiment, the switching of the two readout wirings V1 and V2 is conducted in front of the integrating circuit. However, the switching position should not be specially limited. For instance, the low resolution output and a high resolution output may be simultaneously stored in a memory and either of the data may be selected as necessary. Alternatively, if desired, the both outputs may be used.

Figure 23:
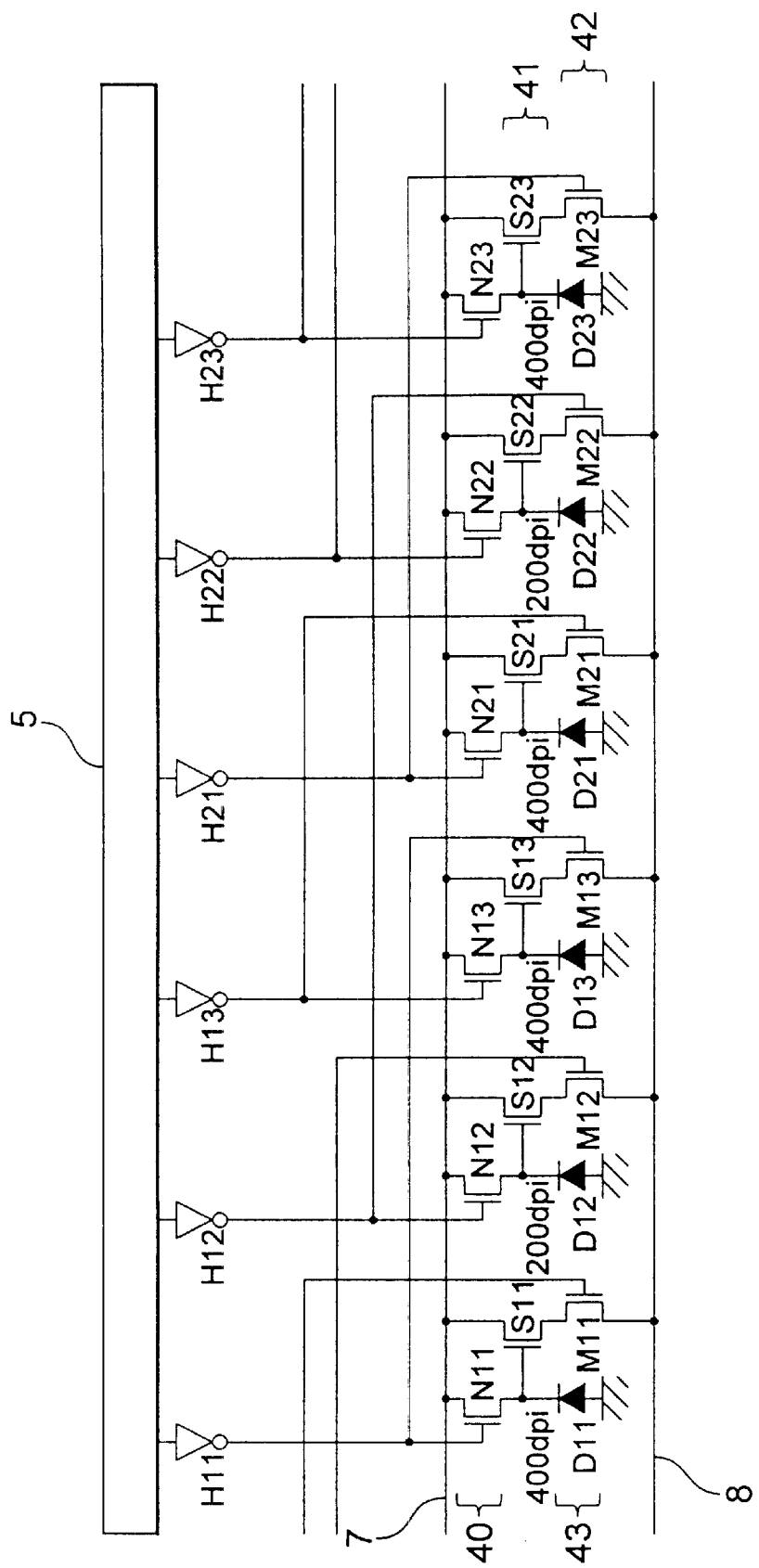
FIG. 23 is a circuit diagram showing the structure of an image sensor in the fifth embodiment according to the present invention.

Next, the fifth embodiment according to the present invention will be described. In the fifth embodiment, amplifiers are connected to light receiving elements, respectively. FIG. 23 is a circuit diagram showing the structure of an image sensor in the fifth embodiment according to the present invention.

An image sensor in the fifth embodiment is, as in the case of the first and other embodiments, a close-contact type line image sensor which can select one of two types of resolutions (200 dpi and 400 dpi).

FIG. 23 shows two photodiodes D12 and D12 for 200 dpi resolution and four photodiodes D11, D13, D21 and D23 for 400 dpi resolution. The number of photodiodes should not be, however, limited thereto.

In the fifth embodiment, a driver circuit 5, switches 40 for resetting photodiodes, respectively, source-follower amplifiers 41, pixel switches 42 and photodiodes 43 are formed on a single glass substrate. The CMOS type driver circuit 5, switches 40, source-follower amplifiers 41 and pixel switches 42 are formed by using polycrystalline silicon transistors, respectively.

The size and pitch of the photodiodes are the same as those in the preceding embodiments. That is, the shape of a photodiode for 200 dpi resolution is a square having equal sides of 100 μm in length and the pitch of the photodiodes therefor is 127 μm. The shape of a photodiode for 400 dpi resolution is a square having equal sides of 50 μm in length and the pitch of the photodiodes is 63.5 μm.

A photodiode array for 200 dpi and that for 400 dpi are laid out in parallel.

The cathode electrode of each of the photodiodes is connected to a common bias line 7 through the corresponding switch 40 which resets the photodiode. A voltage of 5V corresponding to the reverse bias of the photodiode is applied to the common bias line 7 through a connection pad from the outside of the substrate. The anode of each of the photodiodes is connected to a constant voltage source. The constant voltage source may be, for example, a ground.

The cathode electrode of each photodiode is also connected to the input terminal of the corresponding source-follower amplifier 41. The output terminal of the source-follower amplifier 41 is connected to a common readout wiring 8 through the corresponding pixel switch 42.

As the driver circuit 5, the circuit provided in, for example, the second embodiment may be used. In that case, if 400 dpi resolution is selected, pulses are sequentially outputted to inverters H11, H13, H21, H21, . . . . If 200 dpi resolution is selected, pulses are sequentially outputted to inverters H12, H22, . . .

If the sensor is employed for 400 dpi resolution and a pulse is outputted to, for example, the inverter F11, the photodiode D11 is reset by the switch N11 for resetting the photodiode D11. At the same time, the pixel switch M13 for 400 dpi resolution is selected and the signal of the photodiode D13 is outputted to the common readout wiring 8 through the source-follower amplifier S13. Thereafter, this operation is sequentially repeated, the photodiodes D13, D21, D23, . . . are sequentially reset and the signals of the photodiodes D21, D23, D31, . . . are sequentially outputted to the common readout wiring 8.

If the sensor is used for 200 dpi resolution and a pulse is outputted to, for example, the inverter F12, the photodiode D12 is reset by the switch N12 for resetting the photodiode D12. At the same time, the next pixel switch M22 for 200 dpi resolution is selected and the signal of the photodiode D22 is outputted to the common readout wiring 8 through the source-follower amplifier S22. Thereafter, this operation is sequentially repeated. The photodiodes D22, D32, . . . are sequentially reset and the signals of the photodiodes D32, D42, . . . are sequentially outputted to the wiring 8.

Figure 24:
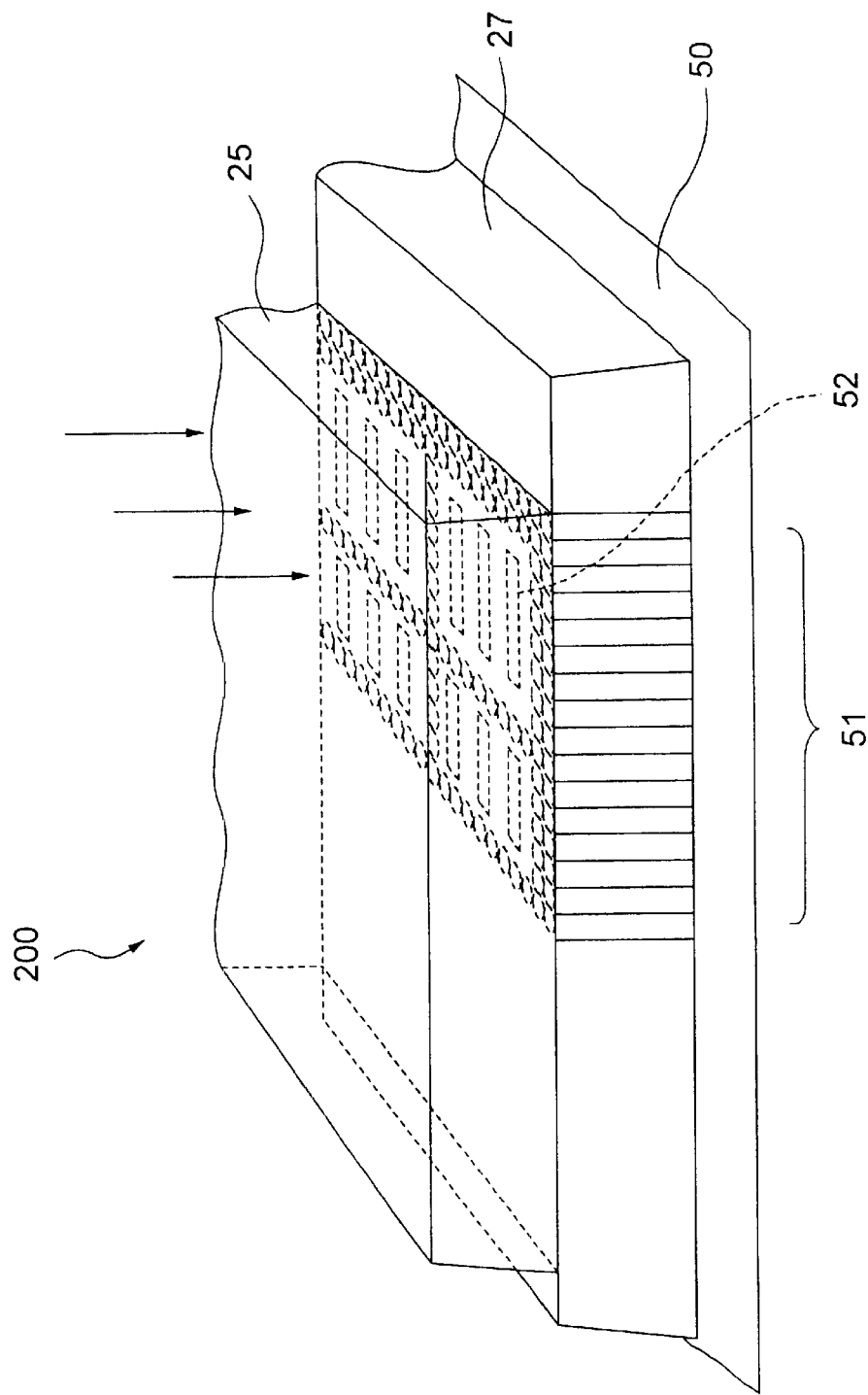
FIG. 24 is a typically perspective view showing the structure of an image reader in one embodiment according to the present invention.

Next, description will be given to a reader in which any image sensor in the preceding embodiments is built. FIG. 24 is a typically perspective view showing the structure of an image reader in one embodiment according to the present invention.

The image reader in this embodiment is a complete close-contact type image sensor using an optical fiber array 51 and forming an image of a manuscript 50. Although a light receiving surface of the sensor is formed on the surface of a glass substrate 25, FIG. 24 shows a state in which the sensor being is used, so that the light receiving surface of the sensor is positioned below the glass substrate 25.

A rectangular opening portion 52 is formed in each of light receiving elements so that illumination light can efficiently reach the original. The light receiving side of the image sensor 3 fixedly faces the optical fiber array by, for example, an adhesive agent.

A protective member 27 is provided between the manuscript 50 and the image sensor 3.

In the image reader 200 constituted as stated above, information on the manuscript is read by shifting the position of the reader 200 relative to the manuscript 50. At this time, a driving method for carrying the manuscript, a method of moving the reader 200 and reading information of manuscript based on the signal of a moving amount detector, a method of sequentially switching over original illumination colors and reading color information and the like are adopted. They are all well-known methods and their detailed descriptions will not be, therefore, given herein.

The particularly important and characteristic feature of this embodiment is that an apparatus for switching over a unit moving amount in a sub-scanning direction according to the selection of the resolution of the image sensor, is provided. If the manuscript is carried, for example, and the resolution of the image sensor is set at 200 dpi, then the unit moving amount is set at 127 μm. If the resolution is set at 400 dpi, the unit moving amount is set at 63.5 μm. They correspond to the pitch of the light receiving elements in any of the preceding embodiments.

As shown in FIG. 24, since a plurality of light receiving element arrays are formed in adjacent regions on the single image sensor substrate, one optical system is shared among the arrays irrespectively of the selected resolution.

In the preceding embodiments, two types of resolutions, i.e., 400 dpi and 200 dpi, are switched over. The types of resolutions should not be limited thereto. A plurality of types of resolutions can be switched over by providing a plurality of light receiving element arrays.

The type of the image sensor should not be limited to a MOS type but the present invention is applicable to any types of image sensors, such as CCD, CMD and BASIS.

According to these embodiments, an image signal from a light receiving element having an optimum light receiving area in main scanning and sub-scanning directions can be obtained according to the selected resolution. Therefore, if the resolution is lowered to (1/R), the sensitivity of the sensor increases about the square of R. This makes it possible to reduce storage time and to read images at high speed when the images are read with low resolution.

In addition, since a plurality of light receiving arrays can be formed in adjacent regions on a single image sensor substrate, it is possible to deal with a plurality of resolutions with one optical system. This can make the apparatus small in size and reduce the number of assembly steps.

Furthermore, a circuit for obtaining an image signal from a light receiving element having an optimum light receiving area according to resolution is simple. Thus, thin film transistor circuits, in particular, can be made with high yield. Besides, the element area and the number of pads less increase due to the provision of resolution switch-over function.

Moreover, if the resolution of the sensor is lowered and signal amount is increased, the number of switches connected to light receiving elements dedicated to low resolution and switched over is lower than the number of the conventional switches. For example, the number of switches may be one, so that mixture of noise resulting from the switching operation is less in degree.

Figure 25:
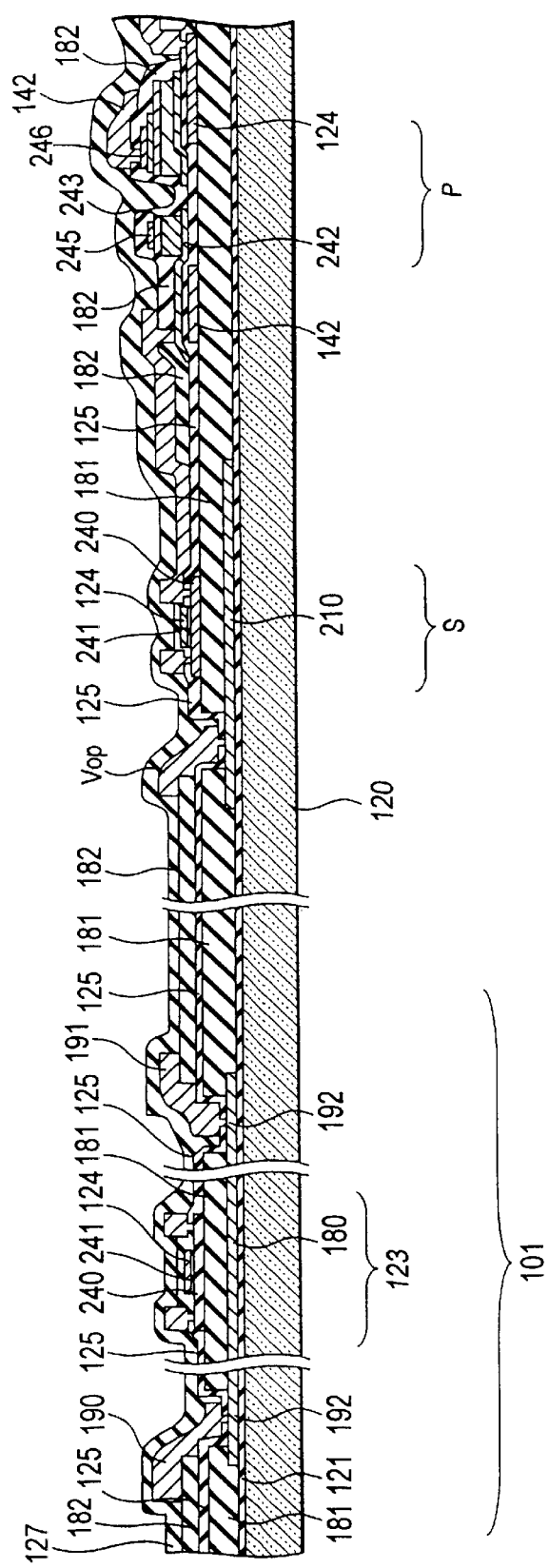
FIG. 25 is a cross-sectional view showing a semiconductor device in one embodiment according to the present invention.

Next, description will be given to a semiconductor device in one embodiment according to the present invention. FIG. 25 is a cross-sectional view showing a semiconductor device in the embodiment according to the present invention.

The semiconductor device in this embodiment is provided with a photodiode P converting an input light to an electric signal, a switch S used for charging the photodiode P and a scanning circuit 101 on/off controlling the switch S.

Figure 26A:
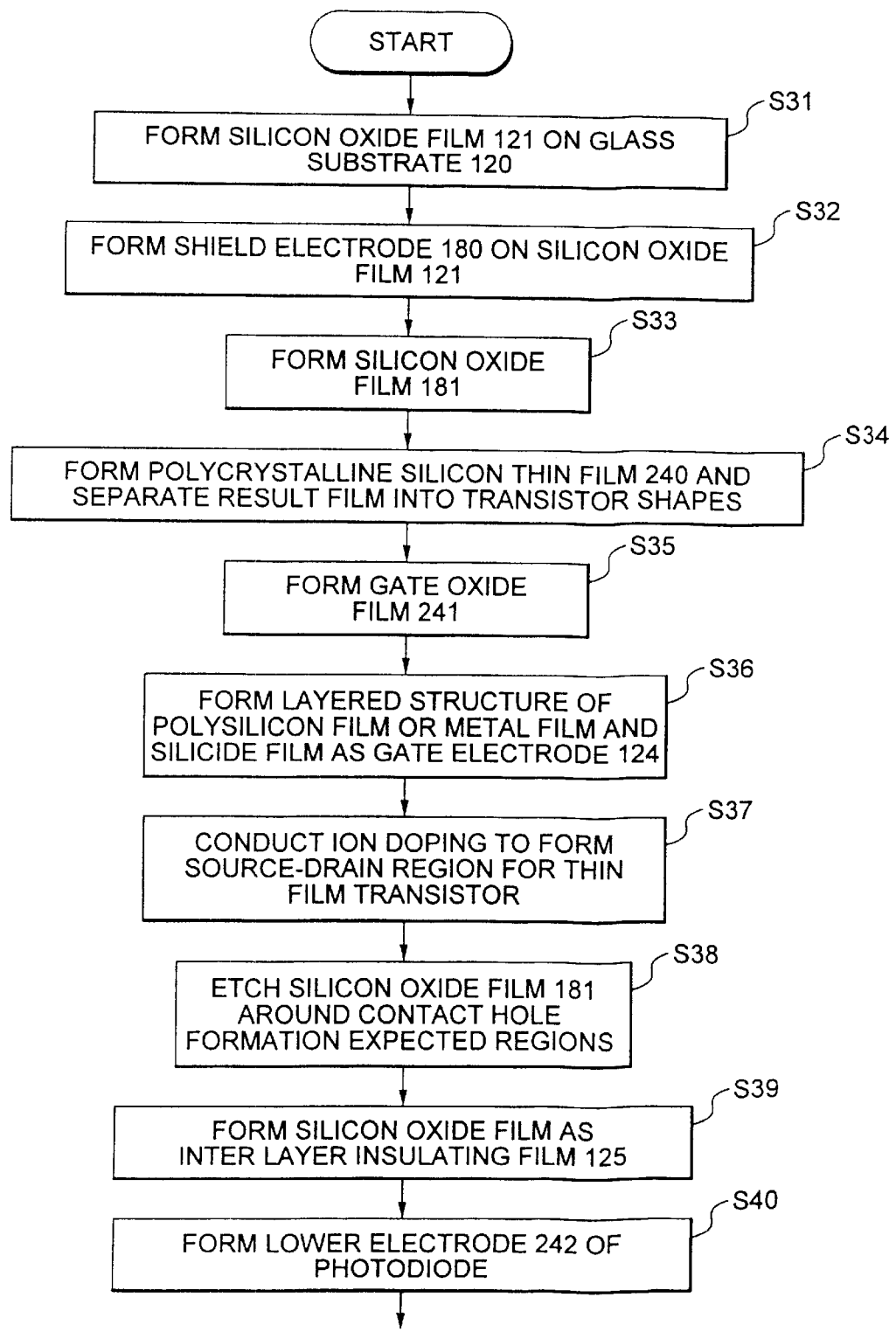
FIGS. 26A and 26B are flowcharts showing the method of manufacturing the semiconductor device in the embodiment according to the present invention.
Figure 27A:
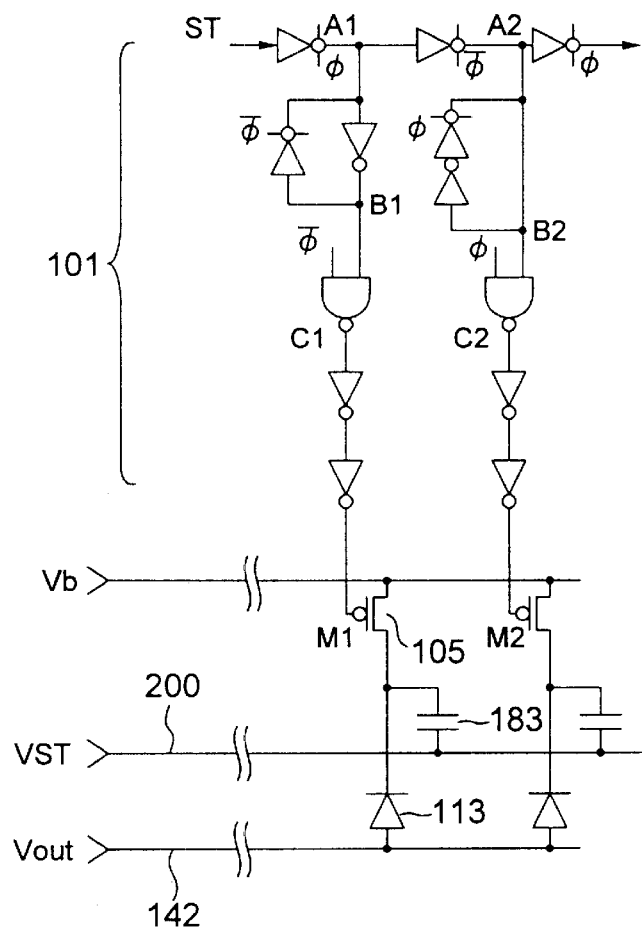
FIG. 27A is a circuit diagram showing the structure of an image sensor in the sixth embodiment according to the present invention and FIG. 27B is a circuit diagram showing the definition of a clocked inverter shown in FIG. 27A.
Figure 27B:
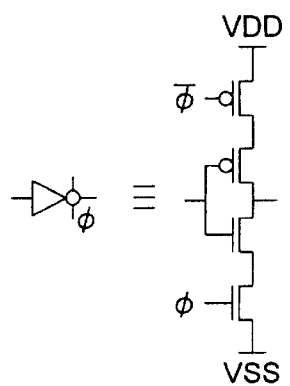

Next, the method of manufacturing the above-stated semiconductor device will be described. FIGS. 26A and 27B are flowcharts showing the method of manufacturing a semiconductor device in the embodiment according to the present invention.

First, as shown in FIG. 26A, a silicon oxide film 121 covering the entire surface is formed on a glass substrate 120 by CVD (chemical vapor deposition) method (step S31). The thickness of the glass substrate 120 may be, for example, 1.1 mm and that of the silicon oxide film 121 may be, for example, about 3000 Å. The silicon oxide film 121 serves to prevent contamination from the glass substrate 120 and to flatten the surface.

Next, the first shield electrode 180 and a light shielding film 210 are formed at positions corresponding to the lower portion of a region in which the scanning circuit 101 is formed and to the lower portion of a region in which a switching transistor 123 is formed, on the silicon oxide film 121 (step S32). The shield electrode 180 is desirably formed of a high melting-point metal so as to resist the process temperature after the formation of the shield electrode. The electrode 180 is formed by, for example, sputtering a WSi film of 1800 Å in thickness by photolithography.

Then, a silicon oxide film 181 covering the entire surfaces of the first shield electrode 180 and the light shield film 210 (step S33). The thickness of the silicon oxide film 181 may be, for example, 10000 Å. Since the thickness of the oxide film 181 determines the capacitance parasitized in the circuit, it is desirably adjusted in accordance with operating speed and power consumption required for this circuit.

Next, a polycrystalline silicon thin film 240 is formed on the silicon oxide film 181 by, for example, CVD method and separated into transistor shapes by photolithography (step S34). The thickness of the polycrystalline silicon film 240 may be, for example, 500 to 1000 Å. Thereafter, a gate oxide film 241 is formed on the polycrystalline silicon thin film 240 (step S35). The thickness of the gate oxide film 241 may be, for example, 100 to 10000 Å. The polycrystalline silicon thin film 240 can be formed under a lower temperature environment by forming an amorphous silicon film by, for example, the CVD method and melting and re-crystallizing the resultant film by a laser annealing method.

A layered structure serving as a gate electrode 124 is formed on the gate oxide film 241 (step S36). The layered structure has, for example, a polysilicon film or a metal film and a silicide film and has a thickness of, for example, about 1000 to 3000 Å. Thereafter, the layered structure is patterned in the same manner as the above-stated method.

Ion doping is conducted to form a source and drain region for a thin film transistor (step S37). At this time, phosphorous (P) ions and boron (B) ions are introduced into an n-type region and a p-type region with predetermined dosage, respectively.

Thus, a thin film transistor 123 having the polycrystalline silicon film as an active layer is formed.

Next, to facilitate contacting the shield electrode 180 with aluminum wirings 190 and 191 to be formed later, the silicon oxide film 181 around an expected region, in which contact holes 192 are formed, is etched (step S38).

Then, a silicon oxide film serving as the first interlayer insulating film 125 covering the entire surface is formed by, for example, the CVD method (step S39). The thickness of the first interlayer insulating film may be, for example, 2000 to 5000 Å. A lower electrode 242 of a photodiode part is formed out of metal such as chromium on the first interlayer insulating film 125 (step S40).

Figure 26B:
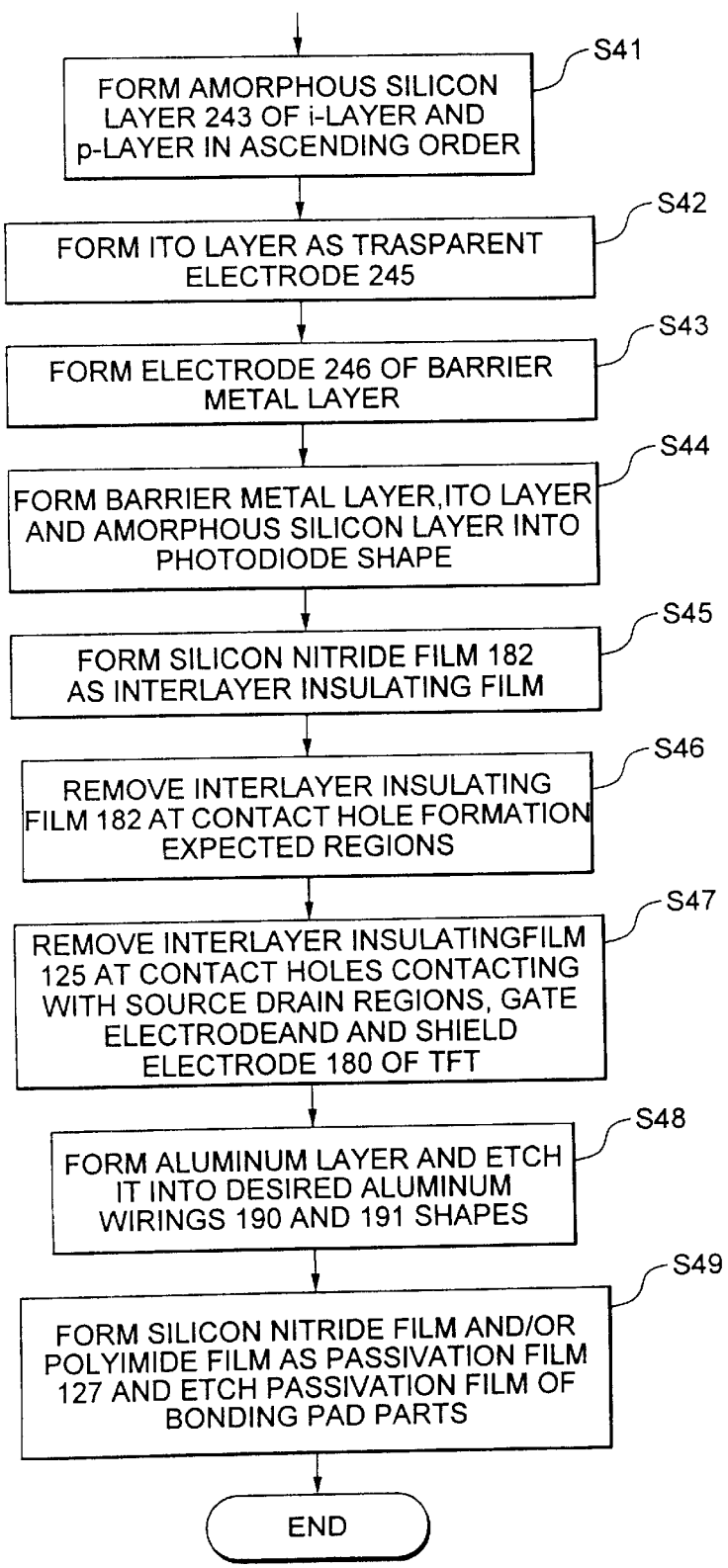

As shown in FIG. 26B, an amorphous silicon layer 243 of an i layer and a p layer in ascending order is formed on the lower electrode 242 by the CVD method (step S41). The thickness of the amorphous silicon film 243 may be, for example, 8000 Å. Then, an ITO layer serving as a transparent electrode 245 is formed on the amorphous silicon film 243 and a barrier metal layer such as tungsten silicide which becomes an electrode 246 is formed (steps S42 and S43). The thickness of the ITO layer may be, for example, 1000 Å and that of the barrier metal layer may be, for example, 500 to 2000 Å. Thereafter, the barrier metal layer, ITO layer and amorphous silicon layer are formed into photodiode shape by photolithography (step S44).

Next, a silicon nitride film serving as the second interlayer insulating film 182 is formed on the entire surface by the CVD system (step S45). The thickness of the second interlayer insulating film 182 may be, for example, about 2000 to 5000 Å.

The second interlayer insulating film 182 present around the thin film transistor region 101 and regions in which the contract hole part of the upper electrode 246 of a photodiode, the contact hole part of the lower electrode 242 of the photodiode and the contact hole 192 contacting with the shield layer are formed, is removed (step S46).

Next, the first interlayer insulating film 125 positioned at portions of the contact holes 192 contacting with the source and drain, the gate electrode and shield electrode 180 of the TFT (thin film transistor) part, is removed (step S47). The aluminum wirings 190 and 191 are then connected to the first shield electrode 180 through may contact holes 192 and etched into desired wiring shapes (step S48). As for contact with the shield electrode, bonding pads are desirably provided on both ends of the aluminum wirings 190 and 191, respectively to decrease the resistance value of the first shield electrode 180. The thickness of each of the aluminum wirings 190 and 191 may be, for example, 5000 to 10000 Å.

A silicon nitride film and/or polyimide film serving as a passivation film 127 are formed on the entire surface and the passivation film 127 of the bonding pad parts is etched (step S49).

It is noted that many transistors 123 are formed between the contact holes 192.

Now, description will be given to the circuit arrangement of an image sensor in this embodiment to which the structure of the above-stated semiconductor device is applied. FIG. 27A is a circuit diagram showing the structure of an image sensor in the sixth embodiment according to the present invention. FIG. 27B is a circuit diagram showing the definition of a clocked inverter in FIG. 27A.

The image sensor in this embodiment is provided with a scanning circuit 101 of CMOS structure consisting of shift registers and buffers, switches 105 consisting of p-type transistors connected to the outputs of the respective stages of the scanning circuit 101, photodiodes 113 connected to the switches 105, respectively, and storage capacitances 183 connected to the switches 105, respectively and storing charge. A clocked inverter consists of two NMOS transistors and PMOS transistors as shown in FIG. 27B.

The shift registers of the scanning circuit 101 are driven by two-phase clock signals (clock 1 (ø) signal and clock 2 (/ø) signal) opposite in phase. An output wiring $V_{OUT}$ 142 connected to all of the photodiodes and a storage capacitance wiring $V_{ST}$ 200 connected to all of the storage capacitances 183 are connected to each other outside of an image sensor substrate. The output signal charge of the image sensor is outputted to terminals to which the wirings are connected. Therefore, the "output wiring", if used in the present specification, means a combination of the $V_{OUT}$ wiring and $V_{ST}$ wiring unless it causes misunderstanding.

Figure 28:
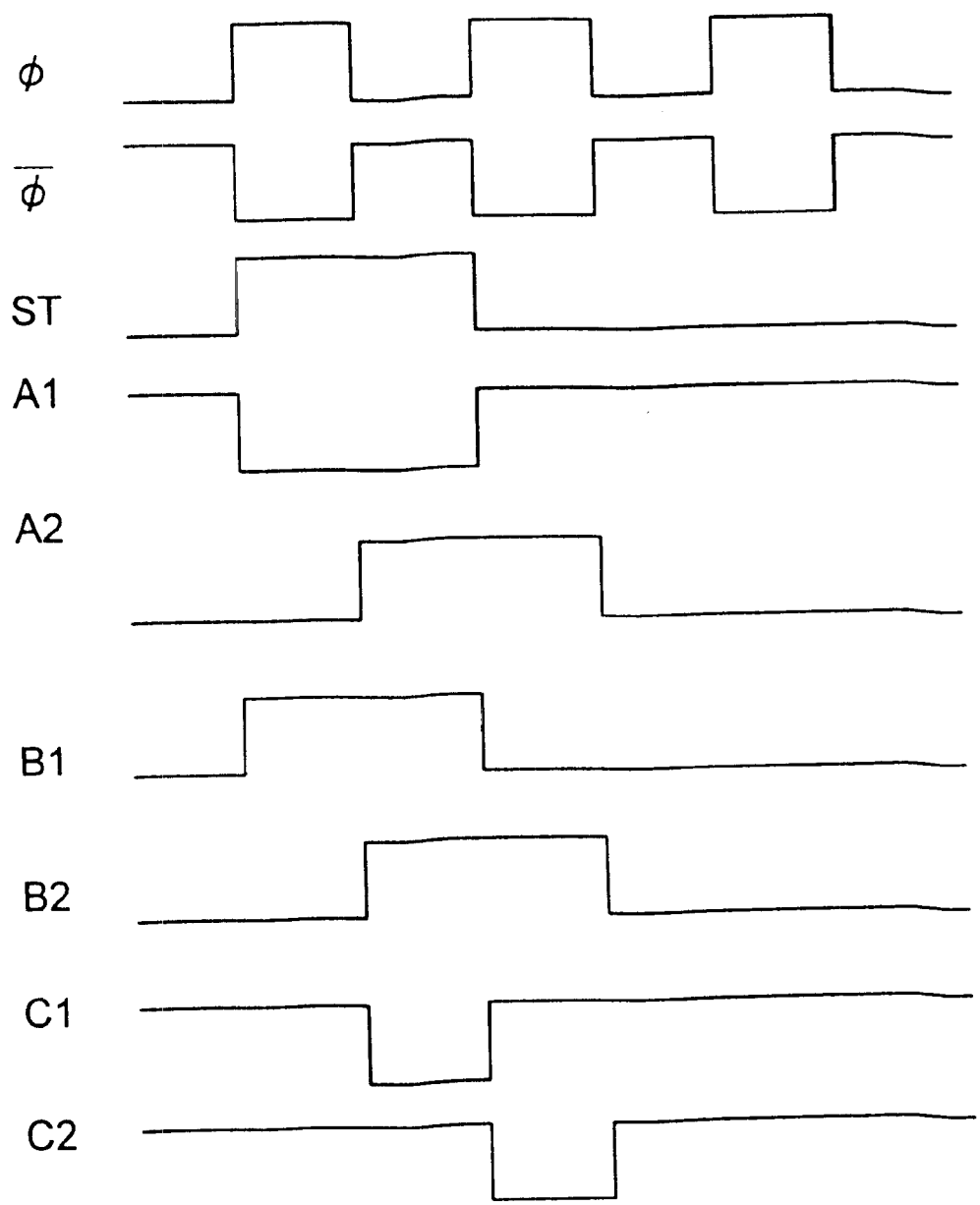
FIG. 28 is a timing chart showing the operation of the image sensor in the sixth embodiment.

Next, the method of driving the image sensor constituted as stated above will be described. FIG. 28 is a timing chart showing the operation of the image sensor in the sixth embodiment according to the present invention. Waveforms correspond to node symbols shown in FIG. 27A, respectively.

In this embodiment, the shift registers is of half-bit structure in which one bit is shifted in half a cycle of each clock. The basic operation of the image sensor employs a so-called storage system in which a reverse bias is applied to a photodiode and charge according to exposure quantity is read in the next scanning. If output signals of the respective stages of the 1728-bit shift registers are sequentially outputted, switching transistors 105 are sequentially selected. Then, the charging currents of the respective photodiodes 113 are outputted to the output wirings 142 and 200. A signal obtained by integrating the charging current for each stage is the charge stored in the photodiode 113 and the storage capacitance 183 according to exposure quantity. The output signal of an integrator becomes a signal level proportional to the exposure quantity.

Figure 29:
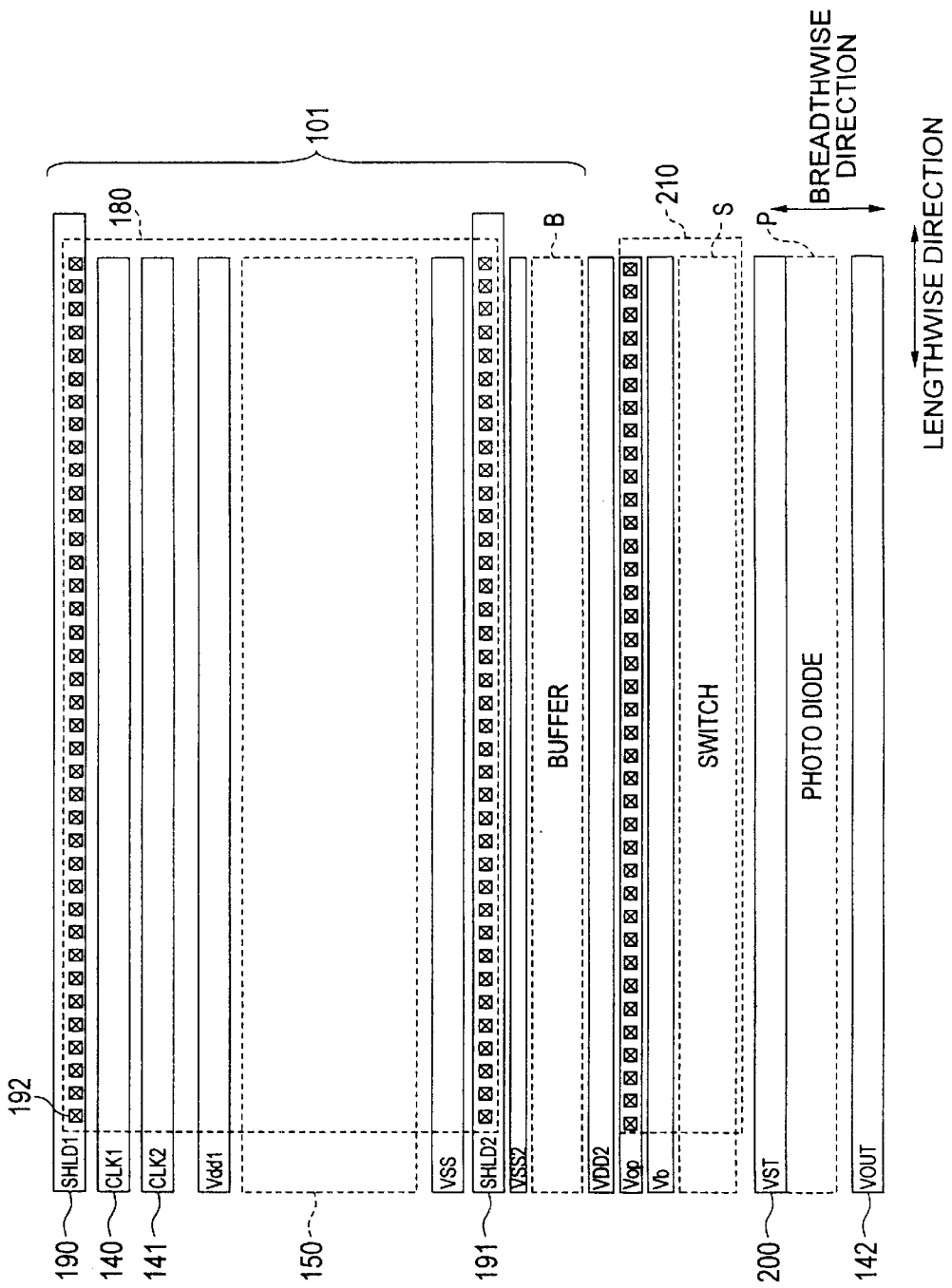
FIG. 29 shows a plane layout of the image sensor in the sixth embodiment.

Next, the plane layout of the above-stated image sensor will be described. FIG. 29 shows the plane layout of the image sensor in the sixth embodiment according to the present invention.

As shown in FIG. 29, the shield electrode 180 is formed on the lower portion of a scanning circuit region. The shield electrode 180 is connected to the aluminum wirings 190 and 191 through a plurality of contacts 192. The connection pads provided on both ends of the aluminum wirings are connected to a constant voltage source such as a ground potential. A plurality of other connection pads are provided in portions other than the both ends of the aluminum wirings. A shield effect can be further improved by connecting them to the constant voltage source.

In this embodiment, the shield electrode 180 is arranged in the scanning circuit region. Therefore, it is possible to prevent not only charge from getting mixed in the output wirings 142 and 200 from the clock bus lines 140 and 141 but also charge from getting mixed in the output wiring from the clock branch lines extending through a transistor arranged region 150.

Meanwhile, no shield electrode is provided in regions in which the output wirings 142 and 200 are formed. This is because a shield electrode, if provided in the regions, shields illumination light. Also, as described in, for example, "Design of Low Noise Electronic Circuit" (translated by Masao SAITO, Kindai-Kagakusha) on page 57, since the increase of the capacitances of the output wirings causes the increase of equivalent input noise of an initial stage amplifier, a shield electrode is not provided in the regions.

Figure 30:
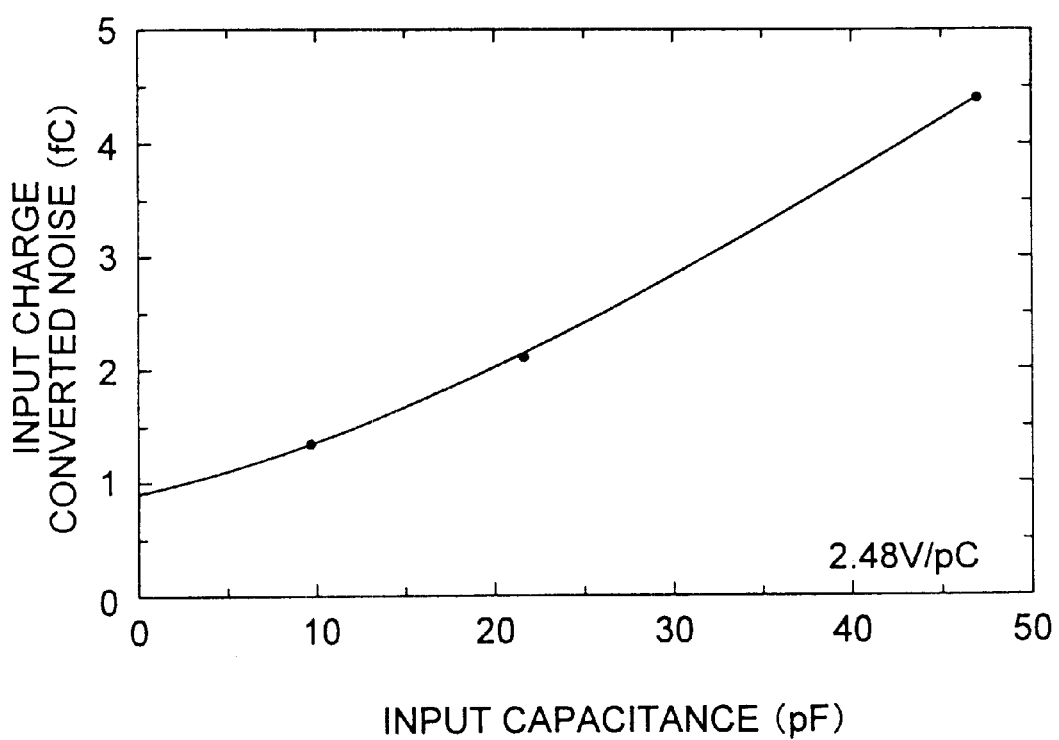
FIG. 30 is a graph showing the relationship between the input capacitance and noise in the image sensor in the sixth embodiment.

FIG. 30 is a graph showing the relationship between input capacitance and noise in the image sensor in the sixth embodiment according to the present invention. In FIG. 30, "2.48 V/pC" is the charge-voltage conversion gain of a detection circuit consisting of an initial stage amplifier 111 and an integrator 112. It means that the initial stage amplifier manufactured outputs a voltage signal of 2.48 V for each charge signal 1 pC of the sensor. As a result of the actual measurement of noise by the inventor of the present invention, as the capacitances (input capacitance) of the output wirings 142 and 200 increase, the quantity of noise increases, as shown in FIG. 30.

According to the sixth embodiment, the first shield electrode 180 is provided below the scanning circuit region. Therefore, the values of the parasitic capacitances C1 and C2 between the clock 1 and 2 wirings 140 and 141 and the output wirings 142 and 200 are not more than 1/20 of those in a case where no shield electrode is provided in that portion. Table 3 shows parasitic capacitance values.

TABLE 3

|  | No shield electrode provided | Sixth embodiment |
|---|---|---|
| C1 (fF) | 840 | 31 |
| C2 (fF) | 605 | 31 |

In addition, as shown in FIG. 29, the same conductive film as the first shield electrode 180 is arranged as a light shielding film 210 below the switching transistor in the sixth embodiment. The light shielding film 210, as in the case of the first shield electrode 180, contacts with the aluminum wirings, and pads are provided on both ends of the aluminum wirings and connected to the ground serving as a constant voltage source.

If an illumination light source is provided on the back side of the image sensor, the light shielding film 210 prevents illumination light from entering an active layer in a channel formation region to thereby reduce leak current while the switches are turned off. Further, by controlling the potential of the light shielding film 210, the threshold voltage of the transistor present above the shield film 210 can be controlled and transistor characteristics can be, therefore, controlled more strictly.

Although FIG. 29 shows the shield electrode 180 and the light shielding film 210 in the scanning circuit region are electrically separated from each other and formed as different electrodes, they may be formed out of a single electrode. That is, an electrode is formed in a region excluding the output wiring regions and the photodiode region. In that case, the electrode exhibits electrostatic shielding function and light shielding function.

Next, the seventh embodiment according to the present invention will be described. In this embodiment, a shield electrode is electrically divided into a plurality of sections. In the sixth embodiment, the first shield electrode is arranged in the overall shift register region. In the case of the sixth embodiment, the shield electrode has impedance. Therefore, there is a possibility that noise may get mixed in the power line and/or shift register circuits through the first shield electrode from the clock wirings.

Figure 31:
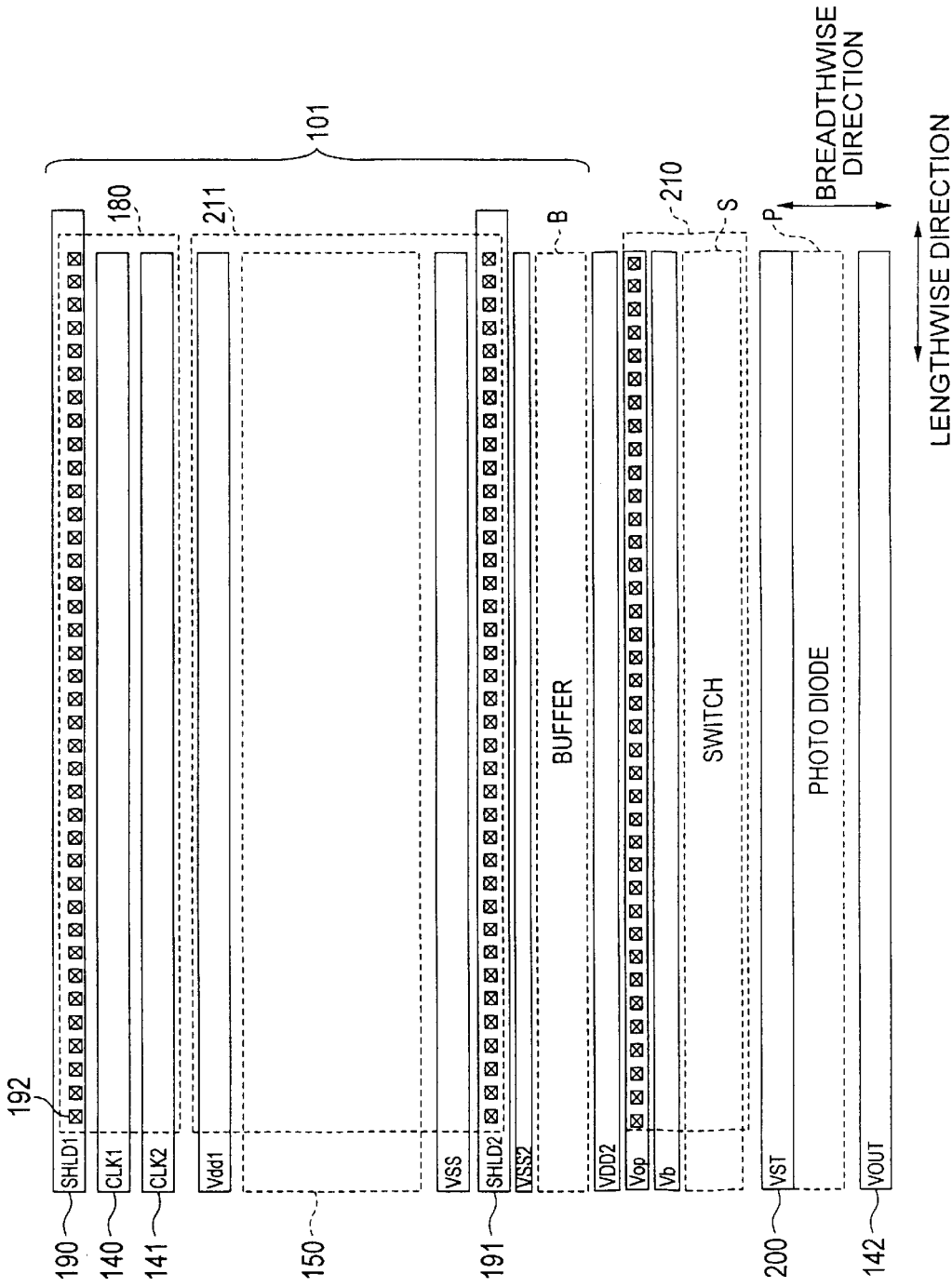
FIG. 31 shows the plane layout of an image sensor in the seventh embodiment according to the present invention.

FIG. 31 shows the plane layout of an image sensor in the seventh embodiment according to the present invention. It is noted that the same constituent elements in the seventh embodiment shown in FIG. 31 as those in the sixth embodiment shown in FIG. 29 are denoted by the same reference symbols and that the detailed description of those elements will not be given herein.

In the seventh embodiment, the first shield electrode 180 is formed below clock bus lines 140 and 141. The second shield electrode 211 is formed in a transistor region 150. These shield electrodes are electrically separated from each other at least in an image sensor substrate.

Figure 32:
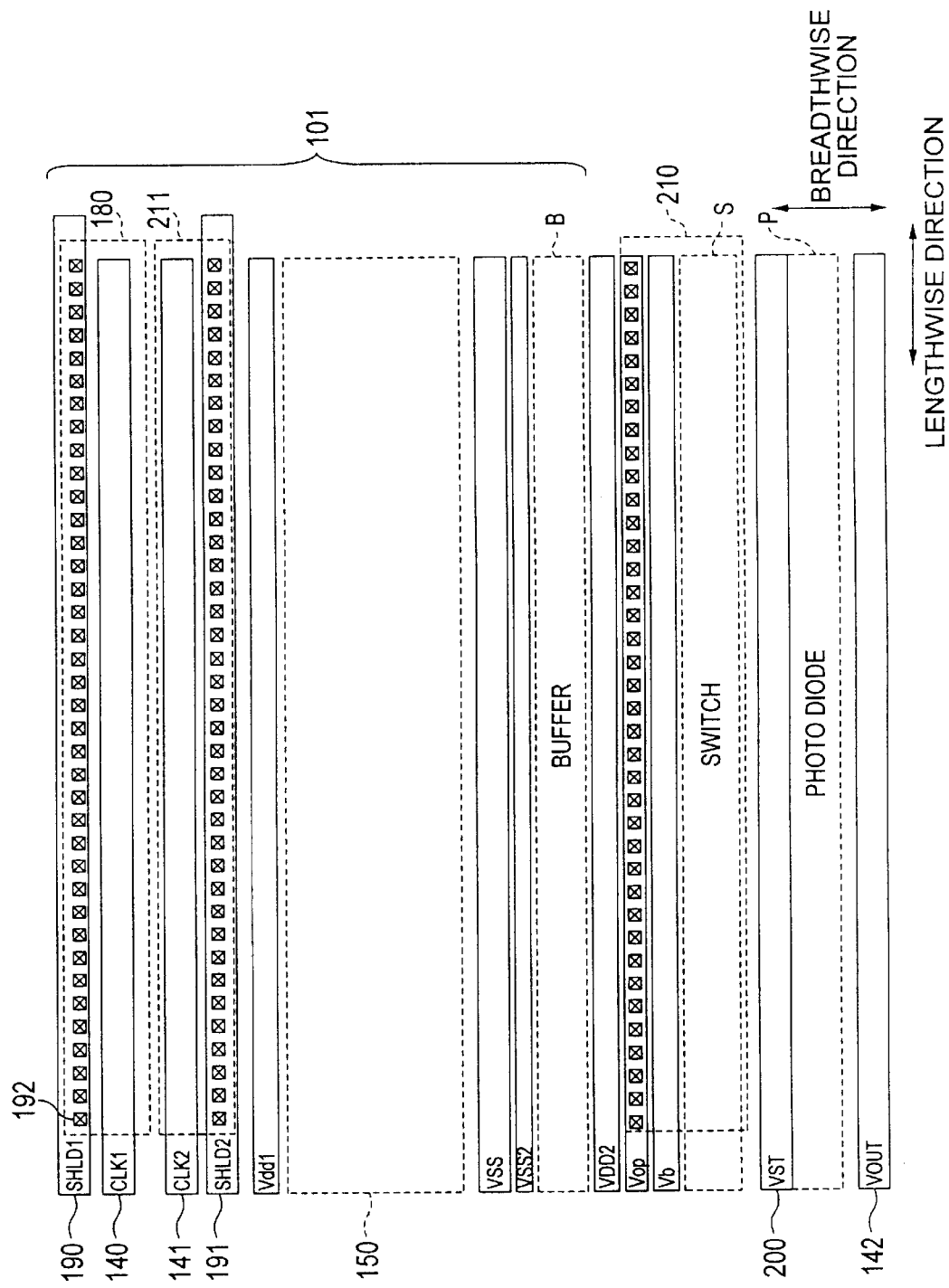
FIG. 32 shows the plane layout of an image sensor in the eighth embodiment according to the present invention.

Next, the eighth embodiment according to the present invention will be described. In this embodiment, shield electrodes are formed only in clock bus line regions. FIG. 32 shows the plane layout of an image sensor in the eighth embodiment according to the present invention. It is noted that the same constituent elements in the eighth embodiment shown in FIG. 32 as those in the seventh embodiment shown in FIG. 31 are denoted by the same reference symbols and that the detailed description of those elements will not be given herein.

In the eighth embodiment, shield electrodes 180 and 211 are formed only in clock bus line regions and no shield electrode is formed in a transistor region 150. Also, the shield electrodes are electrically separated from each other by a clock 1 wiring region 140 and a clock 2 wiring region 141.

In the image sensor in the eighth embodiment constituted as stated above, interference between clock wirings is reduced. In addition, since the parasitic capacitance of the transistor arranged region 150 is reduced, the operating speed of a scanning circuit increases.

Figure 33:
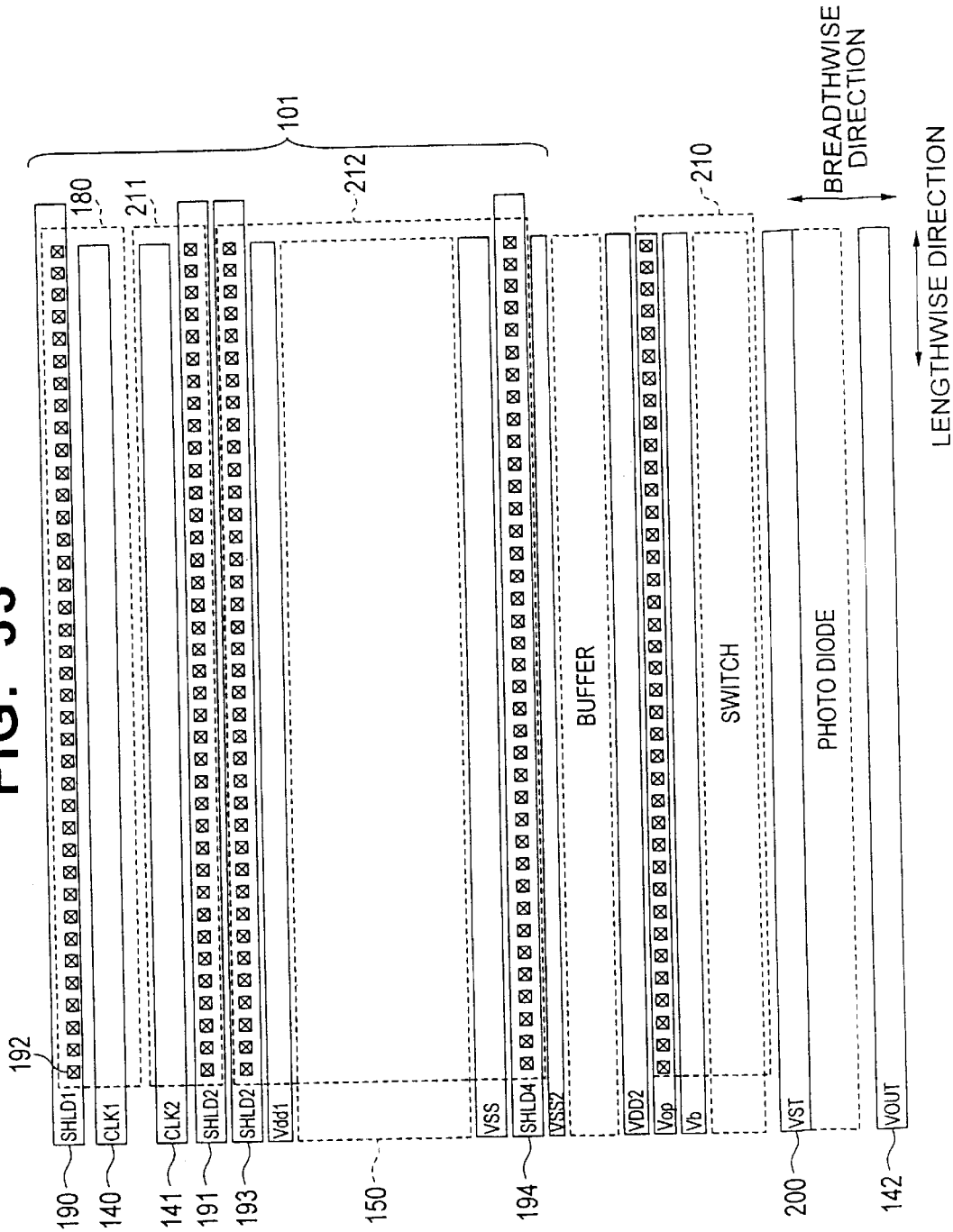
FIG. 33 shows the plane layout of an image sensor in the ninth embodiment according to the present invention.

Next, the ninth embodiment according to the present invention will be described. In this embodiment, shield electrodes are formed in a transistor region and in clock bus line regions, respectively. FIG. 33 shows the plane layout of an image sensor in the ninth embodiment according to the present invention. It is noted that the same constituent elements in the ninth embodiment shown in FIG. 33 as those in the eighth embodiment shown in FIG. 32 are denoted by the same reference symbols and that the detailed description of those elements will not be given herein.

In the ninth embodiment, shield electrodes 180, 211 and 212 are formed in a clock 1 wiring 140 region, a clock 2 wring 141 region and a transistor region 150, respectively. The transistor region 150 is put between a VDD1 wiring and a VSS2 wiring.

In the image sensor in the ninth embodiment constituted as stated above, interference between clock signals is reduced and parasitic capacitances between clock branch lines and output wirings are reduced as well.

Next, the tenth embodiment according to the present invention will be described. In the sixth to ninth embodiments stated above, shield electrodes are provided on layers below the wiring layers in the digital circuit region. In the tenth embodiment, shield electrodes are formed not only on the layers below the wiring layers but also in those above the wiring layers. This makes it possible to further reduce noise.

Figure 34:
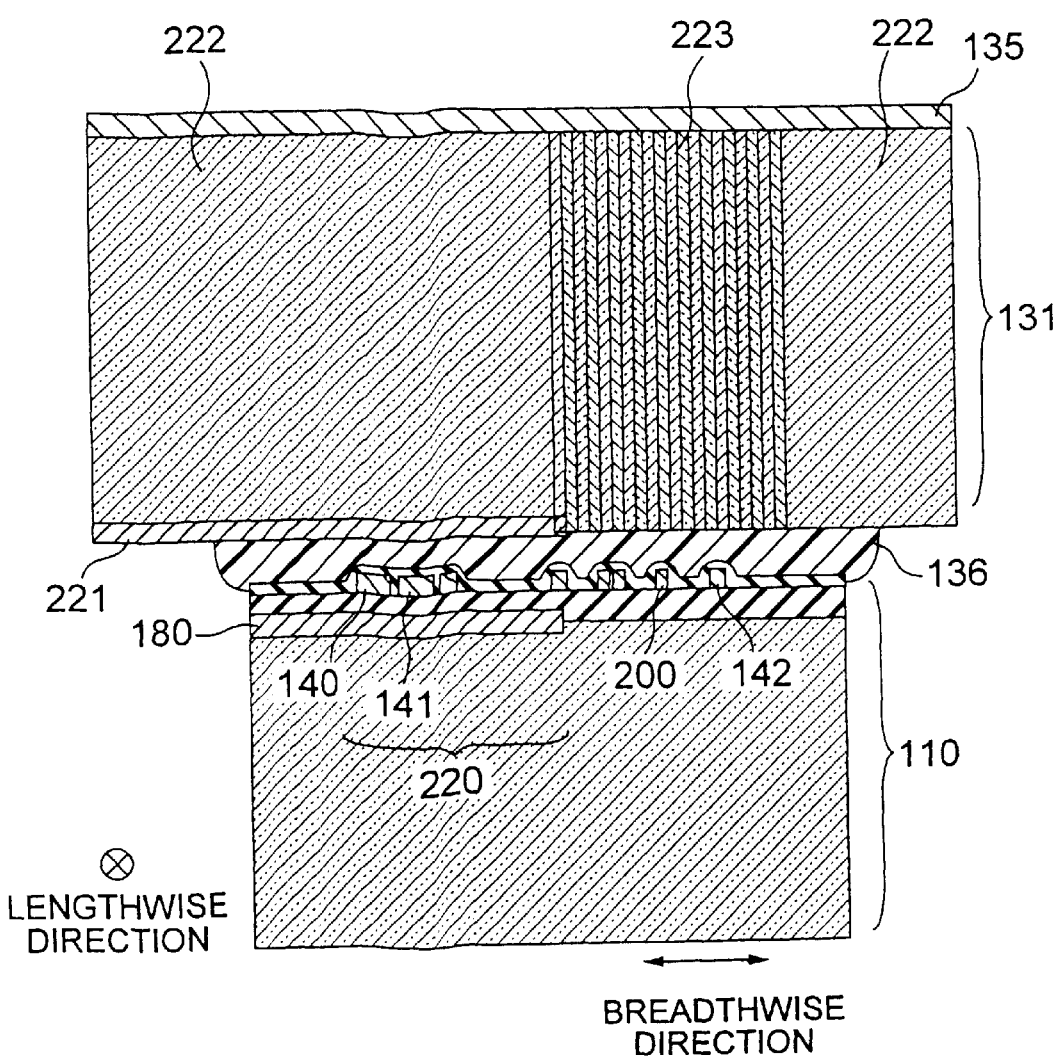
FIG. 34 is a cross-sectional view showing the structure of an image sensor module in the tenth embodiment according to the present invention.

FIG. 34 is a cross-sectional view showing the structure of an image sensor module in the tenth embodiment according to the present invention. It is noted that the same constituent elements in the tenth embodiment shown in FIG. 34 as those in the sixth and other embodiments shown in FIG. 27A and the like are denoted by the same reference symbols and that the detailed description of those elements will not be given herein.

An image sensor 110, in which a shield electrode 180 is formed on a layer below a digital circuit region, is incorporated in an image sensor module in this embodiment. An optical fiber plate 131 is bonded onto the light receiving surface of the image sensor 110 by an adhesive layer 136 made of silicon resin.

For example, an optical fiber plate provided as a product name FAP by Asahi Glass Company may be used as the optical fiber plate 131 in this embodiment. The optical fiber plate 131 has a portion in which optical fibers 223 are bundled into an array and portions of base glass 222 between which the optical fibers 223 are put.

An aluminum film 221 is formed to be deposited on part of the surface on which the optical fiber plate 131 is bonded to the image sensor 110. The optical fiber plate 131 is positioned above the digital circuit region 220 of the image sensor 110 and bonded by an adhesive layer 136 so that the plate 131 is not present above image sensor output wirings 142 and 200.

The shield electrode 180 and the aluminum film 221 are connected to a ground or constant voltage source (not shown). The thickness of the adhesive layer 136 made of silicon resin is preferably as thin as possible in view of optical characteristics; however, in consideration of an assembly method and an attempt to reduce capacitance, the thickness of the layer 180 may be actually set, for example, between 0.1 $\mu$m and 20 $\mu$m.

In the tenth embodiment, the upper and lower surfaces of the digital circuit region 220 are shielded. Therefore, compared with a case where the region is not shielded, the values of parasitic capacitances C1 and C2 between clock wirings and output wirings are reduced by not less than 10 figures. Table 4 below shows the values of the parasitic capacitances C1 and C2 in this case.

TABLE 4

|  | No shield electrode provided | Tenth embodiment |
| --- | --- | --- |
| C1 (fF) | 840 | $3 \times 10^{-23}$ |
| C2 (fF) | 605 | $2 \times 10^{-29}$ |

If a shield electrode is provided only on the upper layer, i.e., a shield layer 180 is not provided within the image sensor, the shielding effect is low. Table 5 below shows the values of the parasitic capacitances C1 and C2 in this case.

TABLE 5

|  | No shield electrode provided | Shield electrode provided only on upper layer |
| --- | --- | --- |
| C1 (fF) | 840 | 106 |
| C2 (fF) | 605 | 156 |

Figure 35:
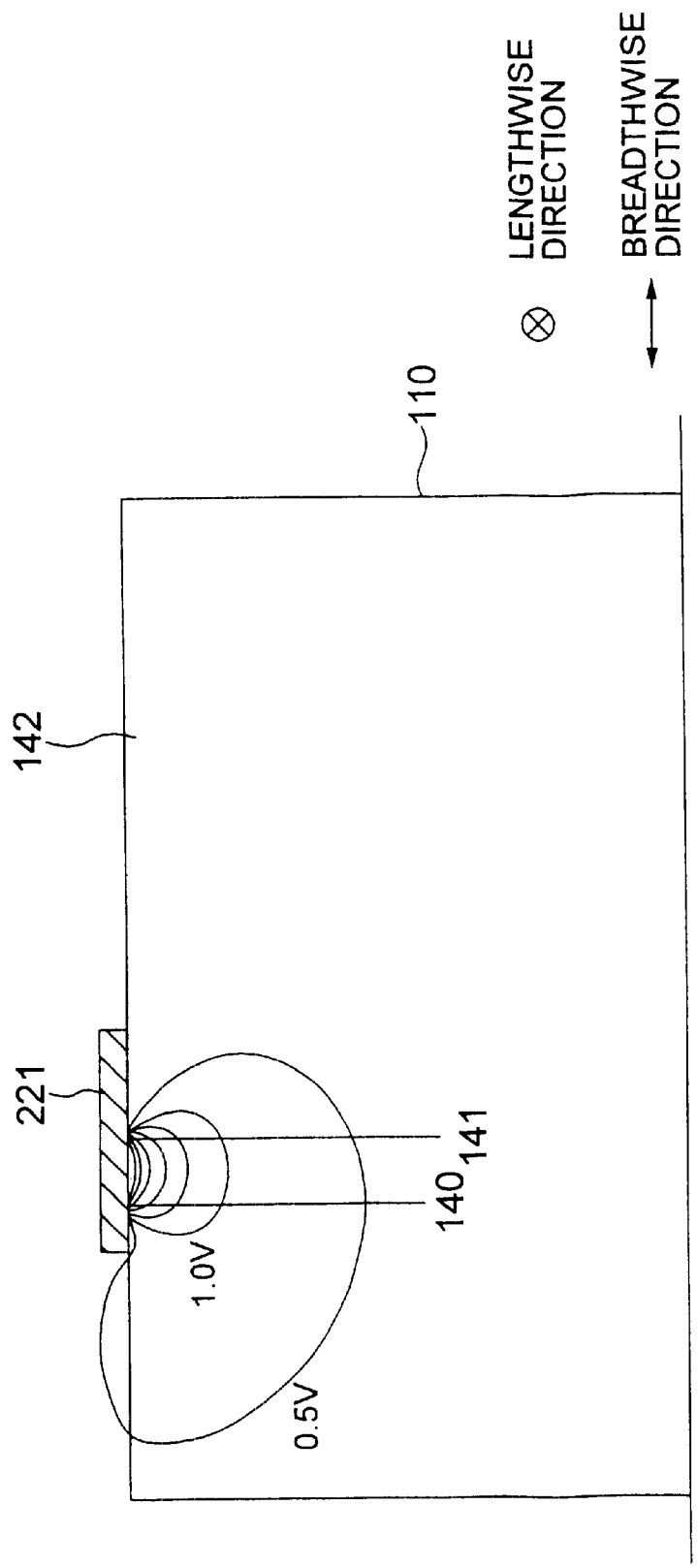
FIG. 35 shows the equipotential resulting from the parasitic capacitances present between a clock 1 wiring and an output wiring if a shield electrode is provided only on an upper layer.

FIG. 35 shows the equipotential resulting from the parasitic capacitances present between the clock 1 wiring and the output wirings if a shield electrode is provided only on the upper layer. In FIG. 35, the potential of the clock 1 wiring is set at 5 V and the potentials of the other wirings are set at 0 V. Even if a shield electrode is provided only on the upper layer, capacitance is formed through a glass substrate serving as a dielectric. For that reason, the effect of reducing parasitic capacitance is not sufficiently obtained if the shield electrode is provided only on the upper layer.

It is noted that an ITO film 135 is formed to be deposited on a surface opposite to that on which the optical fiber plate 131 is bonded to the image sensor 110, that is, on the surface of an original. The ITO film 135 is grounded. The ITO film 135 serves as an effective film against noise and static electricity from the outside of the image sensor module but not against clock noise in the digital circuit region 220. Clock noise is shielded by the shield electrode 180 and the aluminum film 221 provided in the vicinity of the digital circuit region 220 (within 100 $\mu$m from wirings) as already described above. Therefore, a shield layer may not be provided in the vicinity of the output wirings 142 and 200. Consequently, the problem derived from the increase of the capacitances of the output wirings 142 and 200 are avoided.

Figure 36:
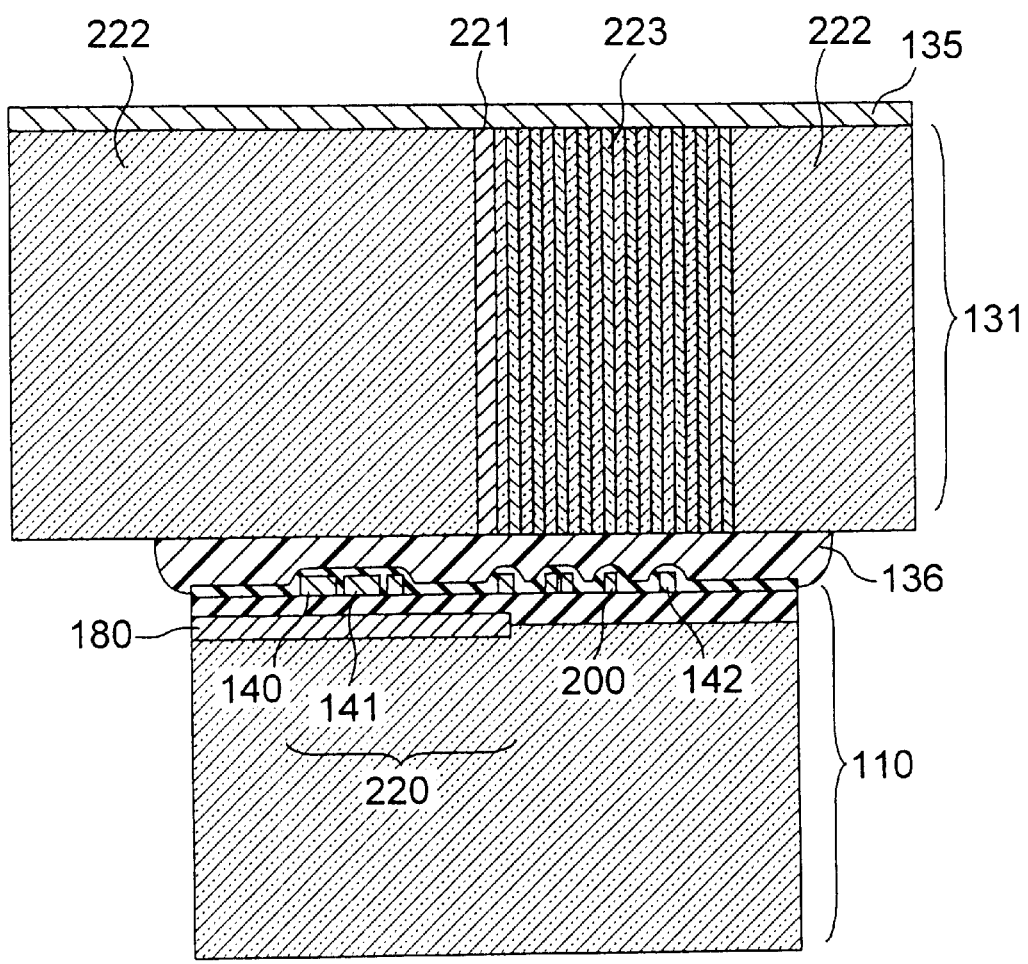
FIG. 36 is a cross-sectional view showing the structure of an image sensor module in the eleventh embodiment according to the present invention.

Next, the eleventh embodiment according to the present invention will be described. In this embodiment, a shield layer is formed on an optical fiber plate bonded to an image sensor. FIG. 36 is a cross-sectional view showing the structure of an image sensor module in the eleventh embodiment according to the present invention. In the eleventh embodiment shown in FIG. 36, the same constituent elements as those in the tenth and other embodiments shown in FIG. 34 and the like are denoted by the same reference symbols and the detailed description of those elements will not be given herein.

In this embodiment, a shield layer 221 is formed in an optical fiber plate 131 to be perpendicular to the bonding surface of the plate 131. The position at which the shield layer 221 is provided is that at which the layer 221 matches between a digital circuit region 220 and output wirings 142 and 220.

According to the eleventh embodiment, coupled capacitance formed in the vicinity of the upper surface of an image sensor 110 is reduced. Therefore, the capacitance load of the digital circuit is reduced to allow the circuit to operate at high speed. Further, the values of parasitic capacitances C1 and C2 are reduced to about not more than 1/100 of those in a case no shield layer is provided. Table 6 below shows the values of the parasitic capacitances C1 and C2 in this case.

TABLE 5

|        | No shield electrode provided | Eleventh embodiment |
|--------|------------------------------|---------------------|
| C1 (fF) | 840                          | 8                   |
| C2 (fF) | 604                          | 5                   |

Figure 37:
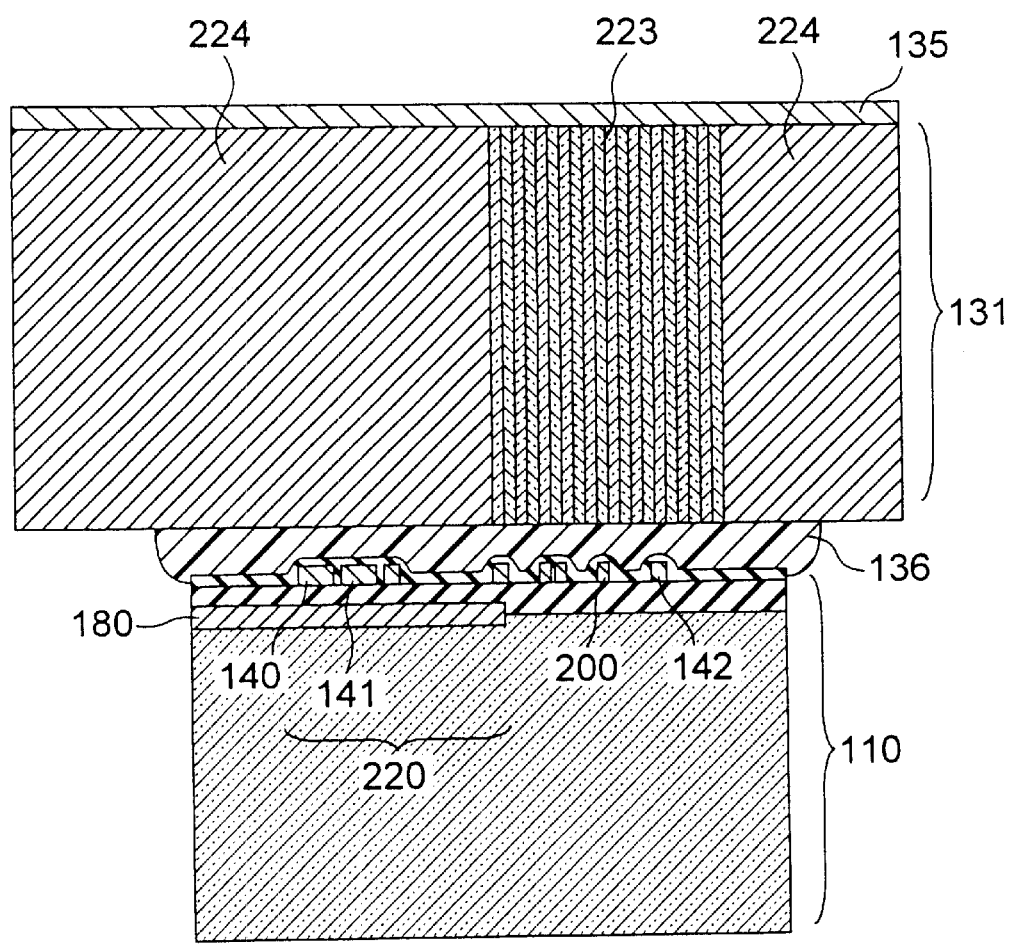
FIG. 37 is a cross-sectional view showing the structure of an image sensor module in the twelfth embodiment according to the present invention.

Next, the twelfth embodiment according to the present invention will be described. In this embodiment, metal plates instead of base glass portions are used in an optical fiber plate. FIG. 37 is a cross-sectional view showing the structure of an image sensor module in the twelfth embodiment according to the present invention. It is noted that the same constituent elements in the twelfth embodiment shown in FIG. 37 as those in the tenth and other embodiments shown in FIG. 34 and the like are denoted by the same reference symbols and that the detailed description of those elements will not be given herein.

In this embodiment, a bundle of optical fibers 223 is put between metal plates 224. The twelfth embodiment thus constituted can obtain a shielding effect equivalent to that in the tenth embodiment.

It is noted that a shield electrode provided above a digital circuit region should not be that provided on an optical fiber plate as an optical component. In an apparatus in which no optical component is bonded, for example, simply grounded metal plates may be bonded to a digital circuit region. Alternatively, a metal plate such as an aluminum film may be patterned on a layer above the digital circuit region in a thin film-forming step and used as a shield electrode.

Further, an image sensor should not be limited to that used as a single apparatus. The present invention is applicable to all circuits formed on an insulating substrate, such as a driver circuit built-in liquid crystal display device.

According to the present invention, electrodes made of conductive layers are provided on layers above and/or below the digital circuit region and no electrode is provided in regions above and below the analog signal wirings. This makes it possible to reduce the coupled capacitance between clock signal wirings and analog wirings to a maximum of not less than five figures. Further, the capacitances of the analog wirings is prevented from increasing. It is, therefore, possible to realize high speed circuit operation and to reduce noise.

Moreover, the shield electrode is formed in the transistor region and not formed in the output wiring regions, thereby preventing illumination light from entering an active layer in a channel formation region and reducing leak current while switches are turned off.

Furthermore, due to the fact that a shield electrode can be formed at an optical component in advance and then bonded to an image sensor, the shield electrode can be aligned at the same time of optical alignment and assembly process can be made simpler.

Additionally, the present invention is applicable not only to an image sensor but also to other semiconductor devices having a digital circuit region and an analog signal wiring region. If applied to the later devices, the same effect can be provided.

As stated so far, according to those embodiments, the coupled capacitance between the clock wirings and analog wirings is reduced and a semiconductor device operating at high speed with less noise can be obtained.

The above-stated embodiments can be combined as necessary. For instance, the first and sixth embodiments can be combined.

What claimed is:

1. An image sensor apparatus comprising:

a substrate; and a plurality of light receiving element groups formed on said substrate, said plurality of light receiving element groups differing in light receiving area from one another.

2. The image sensor apparatus according to claim 1, wherein each of said light receiving element groups comprises a light receiving array, said light receiving array including a plurality of light receiving elements having an equal light receiving area to one another and arranged one-dimensionally, and said plurality of light receiving element groups are arranged such that said respective light receiving element arrays are substantially parallel to one another.

3. The image sensor apparatus according to claim 1, wherein said substrate has light permeability.

4. The image sensor apparatus according to claim 1, wherein said image sensor apparatus is a type of closely contacting an image to be read.

5. The image sensor apparatus according to claim 1, which further comprising:

a drive output circuit provided with shift registers sequentially selecting a light receiving element to be driven out of said light receiving elements at predetermined timing;

a light receiving element array selection control circuit selecting a predetermined light receiving element array from said plurality of light receiving element arrays;

a decoder circuit outputting a light receiving element selection signal for selecting said light receiving element based on output signals of said drive output circuit and said light receiving element array selection control circuit; and pixel switches selectively driving said light receiving elements based on an output signal of said decoder circuit.

6. The image sensor apparatus according to claim 5, wherein

M types of said light receiving arrays exist;

said drive output circuit outputs signals of stages of said shift registers, respectively;

said light receiving element array selection control circuit has at least N control lines, where $N \geq M$; and said decoder circuit has N NAND circuits or NOR circuits, said output signal of said drive output circuit being inputted to one input terminals of said NAND circuits or said NOR circuits and said N control lines being connected to the other input terminals of mutually different said NAND circuits or said NOR circuits.

7. The image sensor apparatus according to claim 1, which further comprising:

a drive output circuit provided with shift registers sequentially selecting a light receiving element to be driven out of said light receiving elements at predetermined timing;

a light receiving element array selection control circuit selecting a predetermined light receiving element array from said plurality of light receiving element arrays; and pixel switches selectively driving said light receiving elements based on an output signal of said drive output circuit.

8. The image sensor apparatus according to claim 2, wherein lengths of sides of said plurality of light receiving elements parallel to a sub-scanning direction are equal among said respective light receiving element arrays, and lengths of sides of said plurality of light receiving elements parallel to a main scanning direction differ among said respective light receiving element arrays.

9. The image sensor apparatus according to claim 8, wherein a shape of each light receiving element forming one light receiving element array is a square and a shape of each light receiving element forming another light receiving element array is a rectangle.

10. The image sensor apparatus according to claim 9, wherein a length of a longer side of said rectangle is not less than twice as large as a length of a shorter side.

11. An image reader for relatively moving a manuscript and an image sensor apparatus and reading an image of said manuscript, said image reader comprising:

an image sensor apparatus according to one of claims 1 to 10;

a control signal generation circuit generating a control signal for controlling an operation of said image sensor in accordance with a resolution selected by a user; and a driver circuit selectively driving said light receiving elements based on said control signal.

* * * * *